US012717475B2

(12) United States Patent
Moon et al.

(10) Patent No.: US 12,717,475 B2
(45) Date of Patent: Aug. 25, 2026

(54) DATA COMPRESSION

(71) Applicant: SAMSUNG ELECTRONICS CO., LTD., Suwon-si (KR)

(72) Inventors: Young Sik Moon, Suwon-si (KR); Jae Hun Jang, Suwon-si (KR); Hyunjoon Yoo, Suwon-si (KR); Soonyoung Kang, Suwon-si (KR); Hanbyeul Na, Suwon-si (KR); Junho Shin, Suwon-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 149 days.

(21) Appl. No.: 18/893,614

(22) Filed: Sep. 23, 2024

(65) Prior Publication Data

US 2025/0238132 A1 Jul. 24, 2025

(30) Foreign Application Priority Data

Jan. 23, 2024 (KR) ........................ 10-2024-0010481

(51) Int. Cl.
*G06F 3/06* (2006.01)
*G06F 11/10* (2006.01)
(Continued)

(52) U.S. Cl.
CPC .......... *G06F 3/0608* (2013.01); *G06F 3/0604* (2013.01); *G06F 3/0616* (2013.01);
(Continued)

(58) Field of Classification Search
CPC .... G06F 3/0608; G06F 3/0655; G06F 3/0679; G06F 12/0246; G06F 2212/7204; G06F 11/1012; G06F 3/0604; G06F 3/0616; G06F 3/0658; G06F 2212/1016; G06F 2212/1036; G11C 29/52; G11C 16/26; G11C 2029/0411; G11C 11/5642;
(Continued)

(56) References Cited

U.S. PATENT DOCUMENTS

| | | | |
|---|---|---|---|
| 8,230,300 | B2 | 7/2012 | Perlmutter et al. |
| 9,229,861 | B2 | 1/2016 | Perlmutter et al. |

(Continued)

FOREIGN PATENT DOCUMENTS

| | | |
|---|---|---|
| KR | 10-2017-0120442 | 10/2017 |

OTHER PUBLICATIONS

Extended European Search Report in European Appln. No. 25151445.1, mailed on May 22, 2025, 9 pages.

*Primary Examiner* — Khai M Nguyen
(74) *Attorney, Agent, or Firm* — Fish & Richardson P.C.

(57) ABSTRACT

Disclosed is a storage device, which includes a nonvolatile memory device that stores or reads user data and a controller that controls the nonvolatile memory device, and the nonvolatile memory device includes a memory cell array including a plurality of memory cells that stores data bits corresponding to the user data, a compression circuit that compresses soft-bit data sensed from the plurality of memory cells, and control logic that controls the compression circuit through a plurality of compression stages and transmits a stage control signal to the compression circuit to control whether compression on each of the plurality of compression stages is performed.

20 Claims, 18 Drawing Sheets

(51) Int. Cl.

| | |
|---|---|
| ***G06F 12/02*** | (2006.01) |
| ***G11C 11/56*** | (2006.01) |
| ***G11C 16/04*** | (2006.01) |
| ***G11C 16/08*** | (2006.01) |
| ***G11C 16/12*** | (2006.01) |
| ***G11C 16/14*** | (2006.01) |
| ***G11C 16/24*** | (2006.01) |
| ***G11C 16/26*** | (2006.01) |
| ***G11C 16/34*** | (2006.01) |
| ***G11C 29/04*** | (2006.01) |
| ***G11C 29/40*** | (2006.01) |
| ***G11C 29/42*** | (2006.01) |
| ***G11C 29/52*** | (2006.01) |
| ***H03M 7/30*** | (2006.01) |

(52) U.S. Cl.

CPC .......... *G06F 3/0655* (2013.01); *G06F 3/0658* (2013.01); *G06F 3/0679* (2013.01); *G06F 11/1012* (2013.01); *G06F 12/0246* (2013.01); *G11C 11/5642* (2013.01); *G11C 16/08* (2013.01); *G11C 16/12* (2013.01); *G11C 16/14* (2013.01); *G11C 16/24* (2013.01); *G11C 16/34* (2013.01); *G11C 29/42* (2013.01); *G11C 29/52* (2013.01); *H03M 7/30* (2013.01); *G06F 2212/1016* (2013.01); *G06F 2212/1036* (2013.01); *G06F 2212/7204* (2013.01); *G11C 16/0483* (2013.01); *G11C 16/26* (2013.01); *G11C 2029/0409* (2013.01); *G11C 2029/0411* (2013.01); *G11C 29/40* (2013.01); *G11C 2211/5641* (2013.01)

(58) Field of Classification Search

CPC ................ G11C 16/0483; G11C 29/40; G11C 2029/0409; G11C 2211/5641; G11C 16/08; G11C 16/12; G11C 16/14; G11C 16/24; G11C 16/34; G11C 29/42; H03M 7/30

USPC ............................................................ 341/87

See application file for complete search history.

(56) References Cited

U.S. PATENT DOCUMENTS

| | | | | |
|---|---|---|---|---|
| 9,672,942 | B2 * | 6/2017 | Yoon | G06F 11/1012 |
| 10,152,380 | B2 | 12/2018 | Yim et al. | |
| 10,157,013 | B2 | 12/2018 | Perlmutter et al. | |
| 10,474,525 | B2 | 11/2019 | Sharon et al. | |
| 11,206,046 | B2 | 12/2021 | Shin et al. | |
| 11,456,758 | B1 | 9/2022 | Zamir et al. | |
| 11,556,416 | B2 | 1/2023 | Tishbi et al. | |
| 11,620,050 | B2 | 4/2023 | Sravan et al. | |
| 2017/0153844 | A1 * | 6/2017 | Kwon | G06F 3/061 |
| 2022/0116053 | A1 | 4/2022 | Zamir et al. | |
| 2022/0164143 | A1 | 5/2022 | Kim et al. | |
| 2023/0034098 | A1 | 2/2023 | Tishbi | |
| 2023/0083903 | A1 | 3/2023 | Hsu et al. | |

* cited by examiner

SOFT_BIT_DATA

Soft-bit Data Converting Circuit

261

IN_DATA

MAP_TAB

SBD1 SBD2 SBD3 SBD4

MD1 MD2 MD3 MD4

ID1 ID2 ID3 ID4

260a
SBLM
DQ
B
0
1 0xFF
2 0x0A
3 0xFF
4 0xFF
5 0xFF
6 0xFF
7 0x33
8 0xFF
9 0xFF
10 0x48
11 0xFF
12 0xFF
13 0xFF
14 0xFF
15 0xFF
16 0x7A
SR1=4:1
CSBD1
1 0x0A
2 0x33
3 0x48
4 0x7A
SR2=2:1
CSBD2
1 0x0A
2 0x48
0x33
0x7A
Index Code For Weak Bit
Dummy Code
Index Code Loss
IN_DATA
Stage Compression Circuit 1
262a
Stage Compression Circuit 2
263a
OUT_DATA

FIG. 16

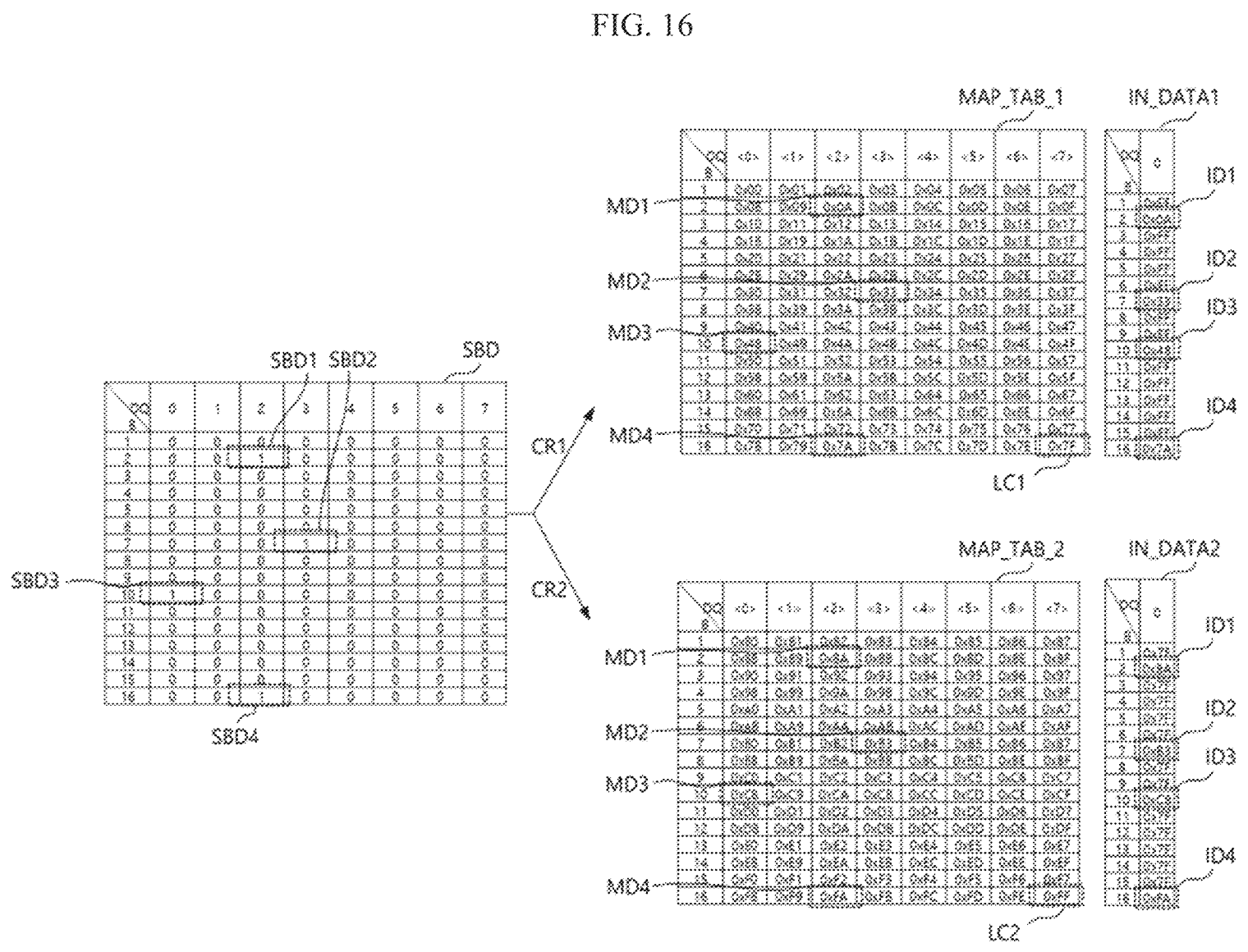

IN_DATA1
ID1
ID2
ID3
ID4
MAP_TAB_1
LC1
MD1
MD2
MD3
MD4

IN_DATA2
ID1
ID2
ID3
ID4
MAP_TAB_2
LC2
MD1
MD2
MD3
MD4

CR1
CR2

SBD
SBD1
SBD2
SBD3
SBD4

FIG. 18

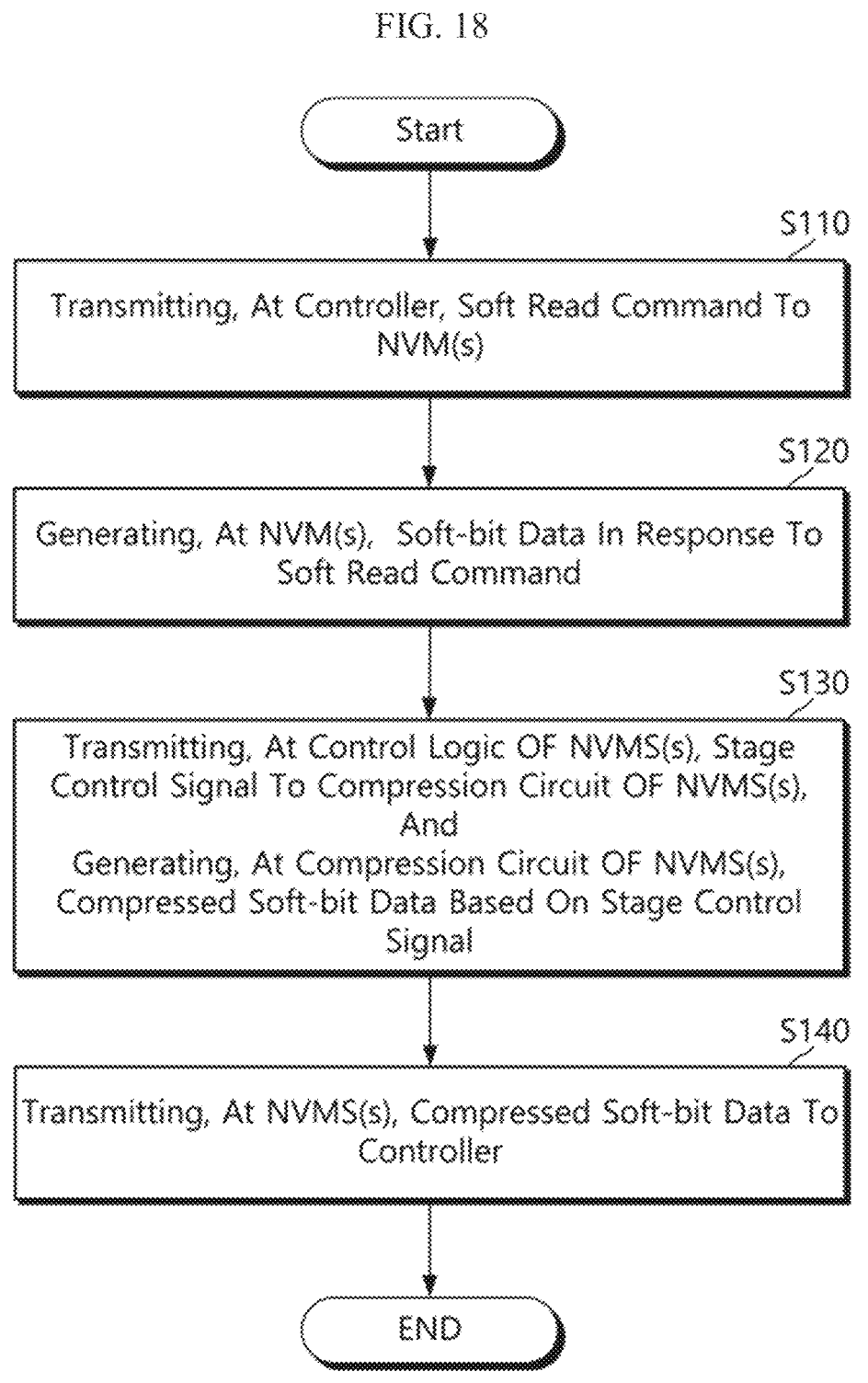

Start

S110

Transmitting, At Controller, Soft Read Command To NVM(s)

S120

Generating, At NVM(s), Soft-bit Data In Response To Soft Read Command

S130

Transmitting, At Control Logic OF NVMS(s), Stage Control Signal To Compression Circuit OF NVMS(s), And
Generating, At Compression Circuit OF NVMS(s), Compressed Soft-bit Data Based On Stage Control Signal

S140

Transmitting, At NVMS(s), Compressed Soft-bit Data To Controller

END

DATA COMPRESSION

CROSS-REFERENCE TO RELATED APPLICATION

This application claims priority under 35 U.S.C. § 119 to Korean Patent Application No. 10-2024-0010481 filed on Jan. 23, 2024, in the Korean Intellectual Property Office, the entirety of which is incorporated by reference herein.

BACKGROUND

With the advancement of technologies such as artificial intelligence (AI), the amount of data being stored and processed is increasing. Due to this, the storage capacity of data centers is continuously increasing. The use of semiconductor device-based storage devices is increasing in data centers and cloud computing environments.

As the use of storage devices increases, research is continuing to improve the performance and lifespan of storage devices. A controller of the storage device controls operations that store data in a nonvolatile memory device or read data from the nonvolatile memory device. Therefore, a data transfer rate between the controller and the nonvolatile memory device affects the performance of the storage device.

SUMMARY

Some implementations according to the present disclosure provide storage devices with improved performance, and methods of operating the same.

Some implementations according to the present disclosure provide storage device with improved lifespans, and methods of operating the same.

Some implementations according to the present disclosure provide storage devices that improve the transfer speed of soft-bit data between a controller and a memory device, and methods of operating the same.

According to some implementations of the present disclosure, a storage device includes a nonvolatile memory device that stores or reads user data and a controller that controls the nonvolatile memory device, and the nonvolatile memory device includes a memory cell array including a plurality of memory cells that stores data bits corresponding to the user data, a compression circuit that compresses soft-bit data sensed from the plurality of memory cells, and control logic that controls the compression circuit through a plurality of compression stages and transmits a stage control signal to the compression circuit to control whether compression on each of the plurality of compression stages is performed.

According to some implementations of the present disclosure, a method of operating a storage device includes transmitting, by a controller controlling a nonvolatile memory device, a soft read command to the nonvolatile memory device, generating, by the nonvolatile memory device, soft-bit data in response to the soft read command, providing, by a control logic circuit of the nonvolatile memory device, a stage control signal to a compression circuit to control the compression circuit through a plurality of compression stages and generating, by the compression circuit, compressed soft-bit data obtained by compressing the soft-bit data based on the stage control signal, and transmitting, by the nonvolatile memory device, the compressed soft-bit data to the controller, and the stage control signal is a signal which controls whether compression on each of the plurality of compression stages is performed.

According to some implementations of the present disclosure, a storage device includes a nonvolatile memory device that stores or reads user data and a controller that controls the nonvolatile memory device, and the nonvolatile memory device includes a memory cell array including a plurality of memory cells that stores data bits corresponding to the user data, a plurality of compression circuits that compresses soft-bit data sensed from the plurality of memory cells, and a control logic circuit that controls the compression circuits, and the plurality of compression circuits include a converting circuit that converts the soft-bit data into input data composed of an index code and a dummy code based on a mapping table, a first compression circuit that compresses the input data at a first compression ratio, and a second compression circuit that receives first output data from the first compression circuit and generates second output data by compressing the first output data at a second compression ratio, and the control logic circuit controls provision of the first output data with respect to the second compression circuit based on a compression ratio of the soft-bit data.

BRIEF DESCRIPTION OF THE DRAWINGS

The above and other objects and features of the present disclosure will become apparent by describing in detail examples thereof with reference to the accompanying drawings.

FIG. 4 is a diagram illustrating an example of a nonvolatile memory device of a storage device.

FIG. 7 is a diagram illustrating an example of operation of a soft-bit data converting circuit.

FIGS. 16 and 17 are diagrams illustrating an example of a method by which a nonvolatile memory device provides a compression ratio change signal to a controller.

FIG. 18 is a diagram illustrating an example of a method of operating a storage device.

DETAILED DESCRIPTION

Figure 1:
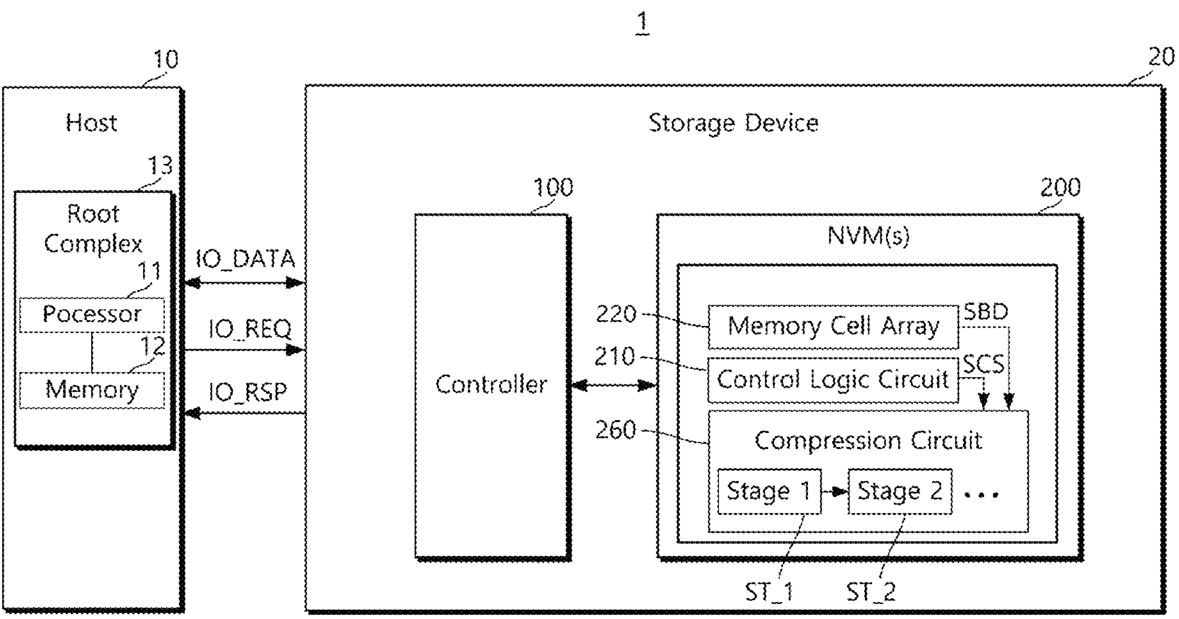
FIG. 1 is a block diagram illustrating an example of a computing system.

FIG. 1 is a block diagram illustrating a computing system 1, according to some implementations of the present disclosure.

A nonvolatile memory device 200 of a storage device 20 may compress soft-bit data SBD and may transmit the compressed soft-bit data to a controller 100 along with hard-bit data. A control logic circuit 210 of the nonvolatile memory device 200 may control a compression circuit 260 including a plurality of compression stages ST_1, ST_2, . . . . Each of the plurality of compression stages ST_1, ST_2, . . . may perform compression on input data. A compression ratio of soft-bit data SBD may be achieved by compression of each of the plurality of compression stages ST_1, ST_2, . . . . The control logic circuit 210 may change the compression ratio of the soft-bit data SBD by controlling whether compression on, by, and/or in each of the plurality of compression stages ST_1, ST_2, . . . is performed.

The computing system 1 may include a host 10 and the storage device 20. The host 10 may communicate with a plurality of storage devices. Other storage devices not illustrated in FIG. 1 may have the same or similar configuration as the storage device 20.

The host 10 controls the overall operation of the storage device 20. The host 10 may transmit a request IO_REQ for input/output (I/O) of data to the storage device 20, and in response thereto, may receive a response IO_RSP for the input/output (I/O) of data from the storage device 20. In addition, the host 10 may transmit data IO_DATA to be written to the nonvolatile memory device 200 to the storage device 20 along with the request IO_REQ for data input, or may receive the data IO_DATA read from the nonvolatile memory device 200 from the storage device 20 in response to the request IO_REQ for data output.

In this specification, the expression "write" refers to data being "stored" or "programmed" in the nonvolatile memory device 200.

The host 10 may include a processor 11 and a volatile memory device 12.

The host 10 may be server(s) of a data center or a cloud system, a personal computer, a laptop computer, etc. The host 10 may be a computing device having the processor 11 configured to process data, and the volatile memory device 12. The processor 11, the volatile memory device 12, a memory controller, a network port, a network interface, etc. may form a root complex 13 of the host 10.

The root complex 13 is a subsystem of the host 10 and may have interconnection and/or bridge functions with internal components and/or peripheral devices. In the example of FIG. 1, it is assumed that the processor 11 is implemented inside the root complex 13. However, depending on the implementation, the root complex 13 and the processor 11 may be implemented separately.

The processor 11 may be a central processing unit (CPU), an application specific integrated circuit (ASIC), a field programmable gate array (FPGA), or any other type of processing device composed of software instructions, microcode, and/or firmware. The processor 11 may be composed of multiple processors.

The volatile memory device 12 may include a static random access memory (SRAM) and a dynamic random access memory (DRAM). The volatile memory device 12 may be composed of a plurality of memory modules. The volatile memory device 12 may store instructions executed by the processor 11.

The storage device 20 may be electrically connected to the host 10 and/or connected through a network, and may include the controller 100 and the at least one nonvolatile memory device 200.

The storage device 20 may be implemented in a state that is physically separated from the host 10, or may be implemented in a form factor mounted in the same package as the host 10. For example, the storage device 20 may be implemented based on the E1.S, E1.L, E3.S, E3.L, and PCIe AIC (CEM) form factors. In some implementations, the storage device 20 is implemented based on a U.2 form factor, an M.2 form factor, or another type of PCIe form factor.

The storage device 20 may be coupled to communicate with other components of the host 10 through a storage interface bus. In some implementations, the storage device 20 is directly mounted on a physical port based on PCIe (Peripheral Component Interconnect Express) of the host 10. The storage interface bus may be, for example, a PCIe bus. The host 10 may transmit and receive data to/from storage device 20 through a storage interface bus using a storage interface protocol. The data may include user data. The storage interface protocol may be, for example, Compute Express Link (CXL), and/or nonvolatile memory host controller express (NVMe).

The controller 100 may control the nonvolatile memory device 200 to perform operations associated with the input/output request IO_REQ from the host 10. The operations associated with the input/output request IO_REQ may include writing, reading, and/or erasing user data requested by the host 10 to the storage device 20.

The controller 100 may correct errors included in the user data read from the nonvolatile memory device 200. In some implementations, the controller 100 corrects errors in user data read using a soft decision process.

The nonvolatile memory device 200 may include (e.g., in a memory cell array 220) a flash memory in a 2D structure or a 3D structure. The flash memory may include, but is not limited to, any other types of nonvolatile memory such as a NAND flash memory, a V-NAND (Vertical NAND) flash memory, a NOR flash memory, a Magnetic RAM (MRAM), a Phase RAM (PRAM), a ferroelectric random access memory (FRAM), a spin transfer torque random access memory (STT-RAM), a resistive RAM (RRAM), etc.

The storage device 20 may include a volatile memory device. At least a portion of the volatile memory device may be used as a working memory. The working memory may include a buffer memory that temporarily stores user data to be written in the nonvolatile memory device 200 or user data read from the nonvolatile memory device 200. The volatile memory device may include volatile memory cells. For example, the volatile memory device may include a dynamic random access memory (DRAM) or a static random access memory (SRAM).

In some implementations, the storage device 20 includes multiple nonvolatile memory devices 200. The nonvolatile memory device 200 may include a memory cell array 220 that stores user data, the control logic circuit 210 that controls the memory cell array 220, and the compression circuit 260 that performs compression on soft-bit data. The soft-bit data SBD may be generated based on data stored in the memory cell array 220.

The compression circuit 260 may perform compression on the soft-bit data SBD through the plurality of compression stages ST_1, ST_2, . . . . At least some of the compression stages among the plurality of compression stages may compress input data provided from a previous compression stage at a preset stage compression ratio to generate output data, and may provide the generated output data to a subsequent compression stage.

In some implementations, to compress the soft-bit data SBD with a preset first compression ratio, among the plurality of compression stages ST_1, ST_2, . . . , one or more of the compression stages perform compression, and one or more remaining compression stages do not perform compression. In some implementations, to compress the soft-bit data SBD with a preset second compression ratio, all of the plurality of compression stages ST_1, ST_2, . . . perform compression.

In some implementations, the control logic circuit 210 transmits a stage control signal SCS that controls whether compression on each of the plurality of compression stages ST_1, ST_2, . . . is performed based on the compression ratio, to the compression circuit 260.

The soft-bit data compressed in the compression circuit 260 may be transmitted to the controller 100. The hard-bit data may be transmitted to the controller 100 along with the compressed soft-bit data.

Figure 2:
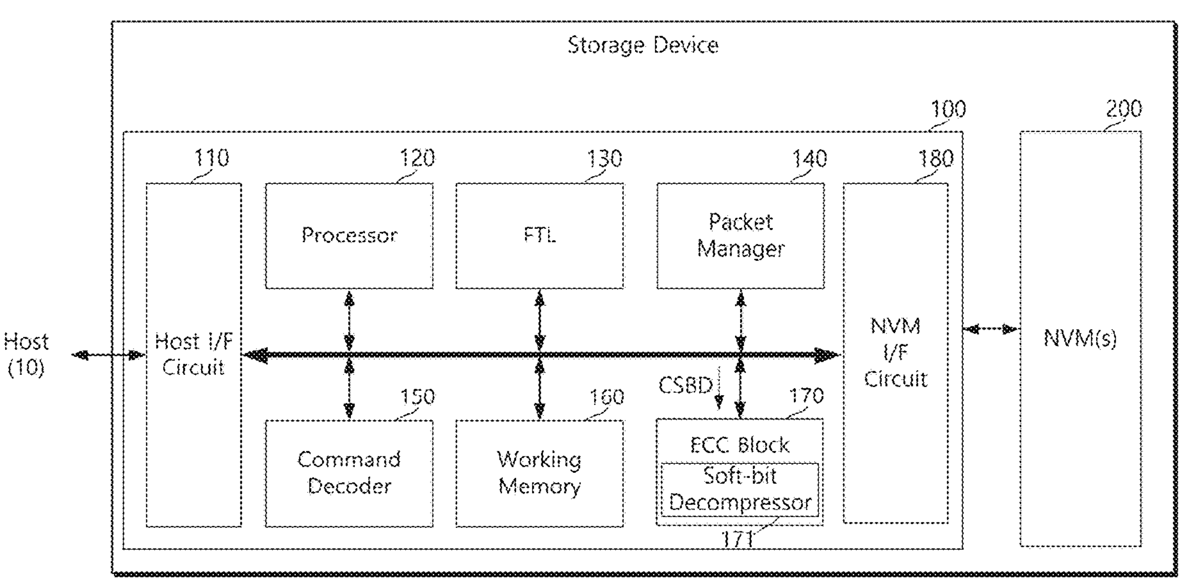
FIG. 2 is a block diagram illustrating an example of a storage device.

FIG. 2 is a block diagram illustrating a configuration of a storage device, according to some implementations of the present disclosure. The storage device 20 of FIG. 2 may correspond to the storage device 20 of FIG. 1.

The storage device 20 may include the controller 100 and the at least one nonvolatile memory device 200.

The controller 100 may include a host interface circuit 110, a processor 120, a flash translation layer (FTL) 130, a packet manager 140, a command decoder 150, a working memory 160, an error correction code block 170, and a nonvolatile memory interface circuit 180.

The controller 100 may communicate with the host 10 through the host interface circuit 110. The host interface circuit 110 may be implemented in various interface methods such as an advanced technology attachment (ATA), a serial ATA (SATA), an external SATA (e-SATA), a small computer small interface (SCSI), a serial attached SCSI (SAS), a peripheral component interconnection (PCI), a PCI express (PCIe), an IEEE 1394, a universal serial bus (USB), a nonvolatile memory express (NVMe), a computer express link (CXL), etc.

The processor 120 may load firmware of the storage device 20 into the working memory 160 and may control the overall operation of the controller 100.

The flash translation layer (FTL) 130 may perform several functions such as address mapping, wear-leveling, and garbage collection.

The flash translation layer (FTL) 130 may perform address mapping to convert a logical address received from the host 10 into a physical address used to actually program data in the nonvolatile memory device 200. To prevent excessive deterioration of specific blocks by ensuring that blocks in the nonvolatile memory device 200 are used uniformly, the flash translation layer (FTL) 130 may perform the wear-leveling by, for example, balancing erase counts of physical blocks. The flash translation layer (FTL) 130 copies the valid data of a block to a new block and then erases the existing block, thereby performing garbage collection to secure usable capacity within the nonvolatile memory device 200.

The packet manager 140 may generate packets according to the protocol of an interface agreed with the host 10, or may parse various information from packets received from the host 10.

The command decoder 150 may decode the command parsed from the packet based on the protocol of the interface agreed to with the host 10. For example, the command decoder 150 may distinguish between a write command, a read command, and/or a flush command by decoding opcode OPCODE of a command based on the NVMe protocol, and the processor 120 may perform the request IO_REQ for input/output of the data requested from the host 10 based on the decoded commands.

The working memory 160 may include registers for storing variables within the controller 100. In some implementations, a portion of the working memory 160 is used as a buffer memory. The buffer memory may temporarily store data to be written in the nonvolatile memory device 200 or data read from the nonvolatile memory device 200. FIG. 2 illustrates that the working memory 160 is located inside the controller 100, but depending on the implementation, all or part of the working memory 160 may be placed inside and/or outside the controller 100. In some implementations, when a host buffer memory is provided in the host 10, the working memory 160 does not operate as a buffer memory.

The ECC block 170 may perform error correction encoding on user data transmitted to the nonvolatile memory device 200 using an error correction code (ECC). The ECC block 170 may perform error correction decoding on user data read from the nonvolatile memory device 200 using the error correction code (ECC). In some implementations, the ECC block 170 performs error correction decoding using a soft decision process on the read user data. The error correction decoding using the soft decision process may be referred to as soft decoding. The ECC block 170 may perform the soft decoding using the soft-bit data. In some implementations, the ECC block 170 performs the soft decoding when (e.g., based on and/or in response to) error correction decoding using the hard decision fails. The error correction decoding using the hard decision may be referred to as hard decoding. The ECC block 170 may perform the hard decoding using the hard-bit data.

In some implementations, the ECC block 170 performs the error correction decoding using at least one of a Low Density Parity Check (LDPC) code, a Reed-Solomon (RS) code, and a Bose-Chaudhuri-Hocquenghem (BCH) code.

The ECC block 170 may include a soft-bit decompressor 171 that decompresses compressed soft-bit data CSBD transmitted from the nonvolatile memory device 200. The soft-bit decompressor 171 may decompress the compressed soft-bit data CSBD to generate the soft-bit data SBD, and the ECC block 170 may perform the error correction decoding using the soft-bit data SBD.

The soft-bit decompressor 171 may determine the compression ratio of the compressed soft-bit data CSBD. In some implementations, the soft-bit decompressor 171 determines the compression ratio of the compressed soft-bit data CSBD based on a compression ratio change signal transmitted from the nonvolatile memory device 200, e.g., as described below with reference to FIG. 15. In some implementations, the soft-bit decompressor 171 determines the compression ratio of the compressed soft-bit data CSBD based on a partial bit sequence of the compressed soft-bit data CSBD, e.g., as described below with respect to FIGS. 16 and 17.

The soft-bit decompressor 171 may decompress the compressed soft-bit data CSBD based on the compression ratio and may generate the soft-bit data.

In some implementations, the ECC block 170 requests the nonvolatile memory device 200 to change the compression ratio of the soft-bit data SBD. For example, the ECC block 170 may transmit a command instructing the nonvolatile memory device 200 to change the compression ratio of the soft-bit data SBD to the nonvolatile memory device 200. In some implementations, the ECC block 170 requests the nonvolatile memory device 200 to change the compression ratio of the soft-bit data SBD based on the occurrence of wear out, the failure rate of error correction decoding, the failure rate of hard decoding, the failure rate of soft decoding, and/or the ratio of error bits. For example, the ECC block 170 may request the nonvolatile memory device 200 to change in the compression ratio of the soft-bit data SBD when at least one of the failure rate of error correction decoding, the failure rate of hard decoding, the failure rate of soft decoding, and/or the ratio of error bits exceeds a preset standard/value.

In some implementations, the ECC block 170 determines a life stage of the nonvolatile memory device 200 based on at least one of the number of wear outs, the failure rate of error correction decoding, the failure rate of hard decoding, the failure rate of soft decoding, and/or the ratio of error bits. The ECC block 170 may request the nonvolatile memory device 200 to change the compression ratio of the soft-bit data SBD to a preset value based on the determined life stage. In addition, or alternatively, the ECC block 170 may determine the life stage of the nonvolatile memory device 200 using various methods known in the art.

Figure 3:
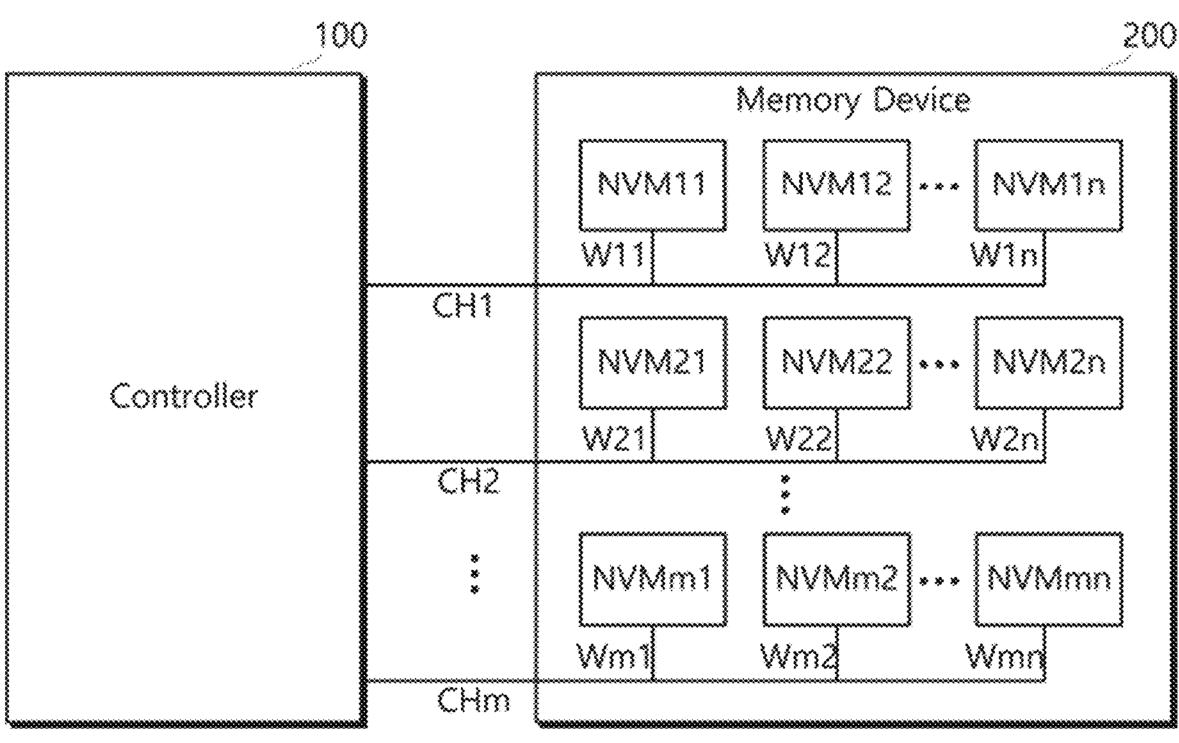
FIG. 3 is a block diagram illustrating an example of a storage device.

FIG. 3 is a block diagram illustrating a storage device, according to some implementations of the present disclosure. The storage device 20 of FIG. 3 may correspond to the storage device 20 of FIGS. 1 and 2.

Referring to FIG. 3, the nonvolatile memory device 200 may be connected to the controller 100 through a plurality of channels CH1 . . . CHm.

The controller 100 may input/output and/or erase data from/to a plurality of nonvolatile memory devices NVM11 to NVMmn through the plurality of channels CH1 . . . CHm.

The controller 100 may control each of the nonvolatile memory devices NVM11 to NVMmn connected to one of the plurality of channels CH1 . . . CHm through ways. For example, the controller 100 may control the nonvolatile memory devices NVM11, NVM12, . . . , and NVM1*n* each connected to the first channel CH1 through ways W11, W12, . . . , and W1*n*.

The controller 100 may exchange signals with the nonvolatile memory device 200 through the plurality of channels CH1 . . . CHm. For example, the controller 100 may transmit commands, addresses, and/or data to the nonvolatile memory device 200 through the channels CH1 . . . CHm, or may receive data from the nonvolatile memory device 200.

The nonvolatile memory device 200 may include the plurality of nonvolatile memory devices NVM11 to NVMmn. Each of the nonvolatile memory devices NVM11 to NVMmn may be a nonvolatile memory package, a nonvolatile memory die, a nonvolatile memory plane, and/or a nonvolatile memory block. In some implementations, when the nonvolatile memory devices NVM11 to NVMmn are nonvolatile memory packages, each nonvolatile memory package may include a plurality of memory dies, but the present disclosure is not limited thereto.

Figure 4:
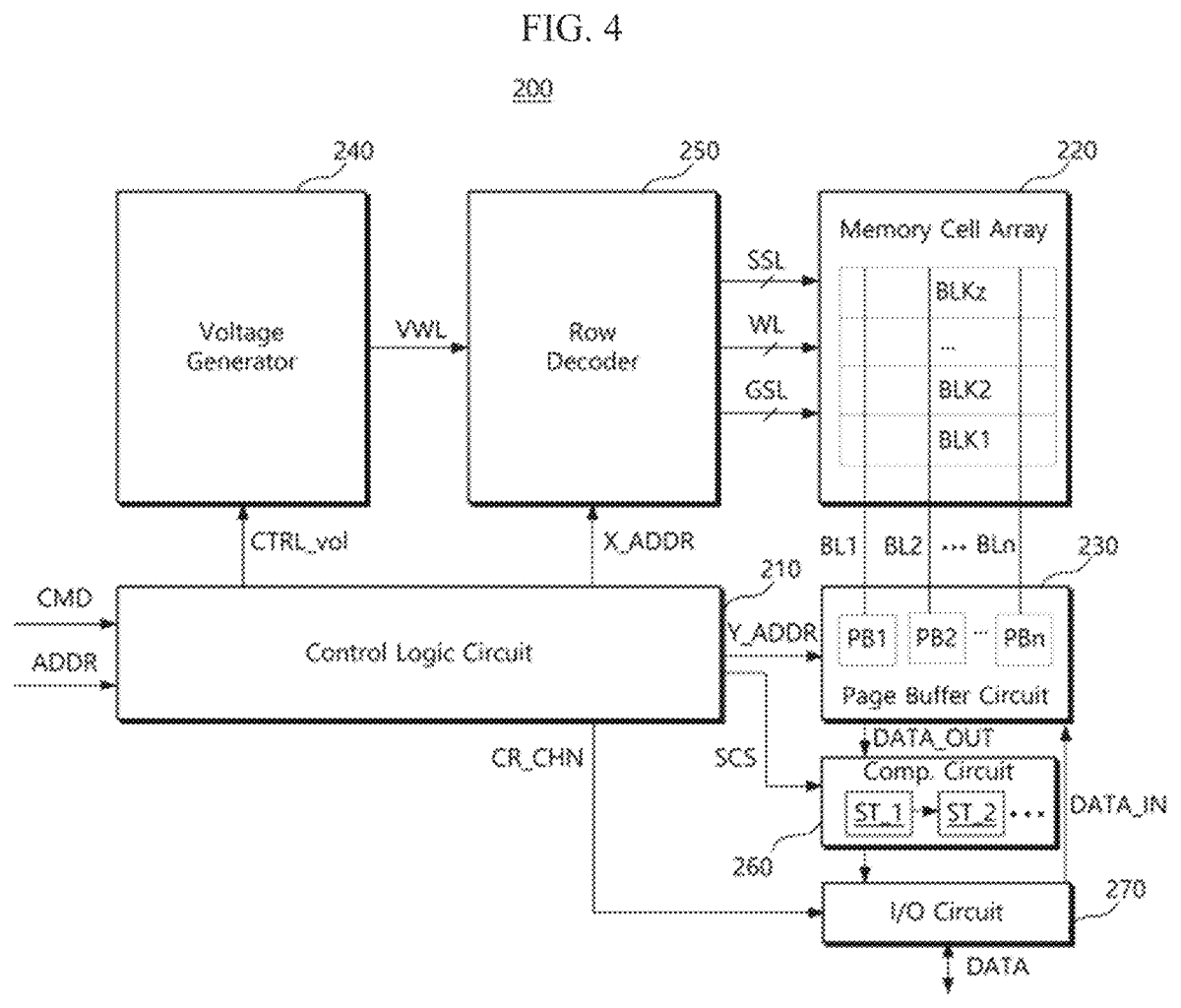

FIG. 4 is a diagram illustrating a configuration of a nonvolatile memory device of a storage device, according to some implementations of the present disclosure. The nonvolatile memory device 200 of FIG. 4 may correspond to the nonvolatile memory device 200 of FIGS. 1, 2, and 3.

Referring to FIG. 4, the nonvolatile memory device 200 may include the control logic circuit 210, the memory cell array 220, a page buffer circuit 230, a voltage generator 240, a row decoder 250, the compression circuit 260, and an input/output circuit 270. Although not illustrated in FIG. 4, the nonvolatile memory device 200 may include components of conventionally known solid state drive memory devices, such as column logic, a pre-decoder, a temperature sensor, a command decoder, and an address decoder.

The control logic circuit 210 may generally control various operations within the nonvolatile memory device 200. The control logic circuit 210 may output various control signals in response to a command CMD and/or a physical address ADDR from a memory interface circuit. For example, the control signals may include a voltage control signal CTRL_vol, a row address X_ADDR, and a column address Y_ADDR.

The memory cell array 220 may include a plurality of memory blocks BLK1 to BLKz ('z' being a positive integer), and each of the plurality of memory blocks BLK1 to BLKz may include a plurality of memory cells. The memory cell array 220 may be connected to the page buffer circuit 230 through bit lines BL1 to BLn, and may be connected to the row decoder 250 through word lines WL, string selection lines SSL, and ground selection lines GSL.

The page buffer circuit 230 may include a plurality of page buffers PB1 to PBn ('n' being an integer of 3 or more). The plurality of page buffers PB1 to PBn may be respectively connected to memory cells within the plurality of memory blocks BLK1 to BLKz through the plurality of bit lines BL1 to BLn. The page buffer circuit 230 may select at least one bit line among the bit lines BL1 to BLn in response to the column address Y_ADDR. The page buffer circuit 230 may operate as a write driver or a sense amplifier depending on an operation mode. For example, during a programming operation, the page buffer circuit 230 may apply a bit line voltage corresponding to data to be programmed to the selected bit line. During a read operation, the page buffer circuit 230 may sense data stored in a memory cell by sensing a current or a voltage of the selected bit line. The page buffer circuit 230 may provide data DATA_OUT sensed from a memory cell to the compression circuit 260.

The voltage generator 240 may generate various types of voltages to perform program, read, and erase operations in response to the voltage control signal CTRL_vol.

The row decoder 250 may select one of the plurality of word lines WL and one of the plurality of string selection lines SSL in response to the row address X_ADDR.

The input/output circuit 270 may transmit data DATA read from the memory cell array 220 to the controller 100. The data DATA transmitted to the controller 100 may include the compressed soft-bit data CSBD. The input/output circuit 270 may provide input data DATA_IN provided by the controller 100 to the page buffer circuit 230. The input data DATA_IN may include user data to be programmed into the memory cell array 220.

The page buffer circuit 230 according to some implementations of the present disclosure senses data stored in a memory cell based on a soft-read voltage and generates the soft-bit data SBD. The page buffer circuit 230 may provide the soft-bit data SBD to the compression circuit 260 as part of the output data DATA_OUT.

The compression circuit 260 may compress the soft-bit data SBD provided by the page buffer circuit 230 through the plurality of compression stages ST_1, ST_2, . . . . The control logic circuit 210 may control the compression circuit 260 using the stage control signal SCS through the plurality of compression stages ST_1, ST_2, . . . . The control logic circuit 210 may transmit different stage control signals SCS to the compression circuit 260 based on the compression ratio of the soft-bit data SBD. The stage control signal SCS may be a signal that indicates whether compression on each of the plurality of compression stages ST_1, ST_2, . . . is performed.

In some implementations, each of the plurality of compression stages ST_1, ST_2, . . . is implemented as a separate stage compression circuit. In some implementations, the plurality of compression stages ST_1, ST_2, . . . are implemented with the same one stage compression circuit. Each of the plurality of compression stages ST_1, ST_2, . . . may receive the output data of a previous compression stage as input data. Each of the plurality of compression stages ST_1, ST_2, . . . may compress input data and may generate output data. Each of the plurality of compression stages ST_1, ST_2, . . . may or may not perform compression based on the stage control signal SCS. When a specific compression stage does not perform compression, output data of the compression stage before the specific compression stage may be transmitted to the controller 100 through the input/output circuit 270.

In some implementations, the compression circuit 260 performs compression only on the soft-bit data SBD and may not perform compression on hard-bit data. For example, the compression circuit 260 may compress only the soft-bit data SBD in response to the stage control signal SCS. The data DATA_OUT other than the soft-bit data SBD may be transmitted to the input/output circuit 270 without compression being performed. In some implementations, the compression circuit 260 performs compression of hard-bit data. The compression of the hard-bit data may use conventionally known compression methods (e.g., compression based on run-length encoding (RLE), etc.) rather than the plurality of compression stages ST_1, ST_2, . . . .

The control logic circuit 210 may change the compression ratio of the soft-bit data SBD. In some implementations, the control logic circuit 210 changes the compression ratio of the soft-bit data SBD in response to the command CMD transmitted from the controller 100 being a request to change the compression ratio. In this case, the control logic circuit 210 may change the stage control signal SCS and may provide the changed stage control signal SCS to the compression circuit 260. For example, the control logic circuit 210 may provide the compression circuit 260 with a first stage control signal SCS that controls compression to be performed in all of the plurality of compression stages ST_1, ST_2, . . . based on a first compression ratio. In response to a request to change the compression ratio from the controller 100, the control logic circuit 210 may provide the compression circuit 260 with a second stage control signal SCS that controls compression to be performed in only some of the plurality of compression stages ST_1, ST_2, . . . based on a second compression ratio.

In some implementations, the control logic circuit 210 determines a change in the compression ratio of the soft-bit data SBD. For example, the control logic circuit 210 may determine a change in the compression ratio of the soft-bit data SBD based on at least one of the ratio and/or the number of weak bits of the soft-bit data SBD, the increasing tendency of the weak bits of the soft-bit data SBD, etc. When the control logic circuit 210 determines to change the compression ratio of the soft-bit data SBD, the control logic circuit 210 may change the stage control signal SCS so as to be provided to the compression circuit 260, and may provide a compression ratio change signal CR_CHN to the controller 100 through the input/output circuit 270.

Figure 5A:
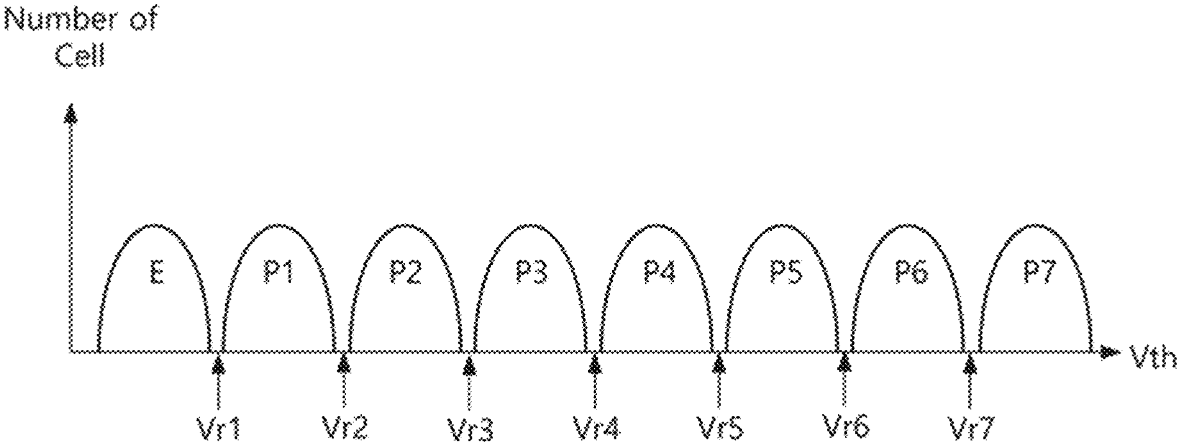
FIG. 5A is a graph illustrating an example of a threshold voltage distribution for a triple level cell (TLC).

FIG. 5A is a graph illustrating a distribution of threshold voltages of memory cells when a memory cell included in the memory cell array is a triple level cell (TLC). The memory cell array described with reference to FIGS. 5A to 5B may correspond to the memory cell array 220 of FIGS. 1 to 4.

Referring to FIG. 5A, when each memory cell of the memory cell array 220 is the triple level cell programmed in 3 bits, the memory cell may have a threshold voltage distribution 'E' corresponding to a erase state or one threshold voltage distribution among threshold voltage distributions P1 to P7 corresponding to first to seventh program states.

A first read voltage Vr1 has a voltage level between the threshold voltage distribution 'E' of the memory cell in the erase state and the threshold voltage distribution P1 of the memory cell in the first program state. Second to seventh read voltages Vr2 to Vr7 have voltage levels between the threshold voltage distributions P1 to P7 of each adjacent corresponding program state. The nonvolatile memory device 200 may apply at least one of the first to seventh read voltages Vr1 to Vr7 and may sense data stored in the memory cell based on the turn-on state or the turn-off state of the memory cell.

Figure 5B:
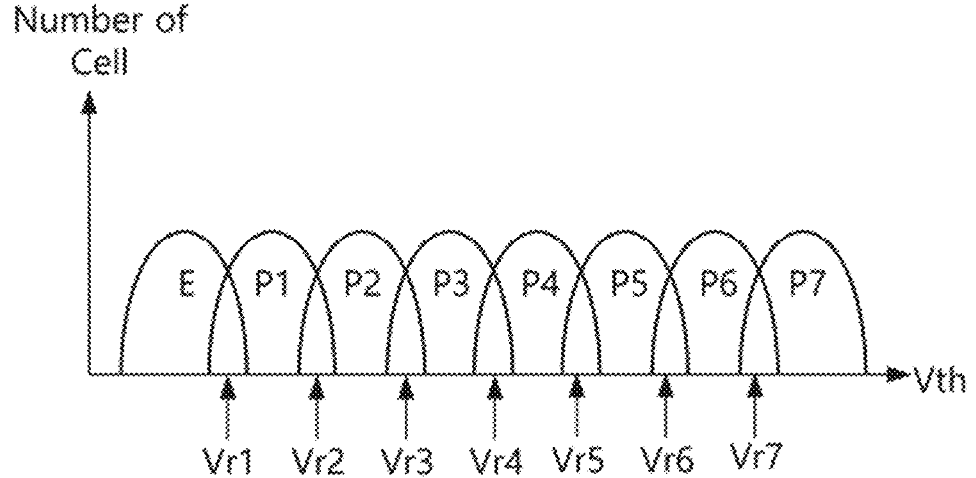
FIG. 5B is a graph illustrating a modification of the distribution of FIG. 5A.

FIG. 5B is a graph illustrating a case where a distribution of a threshold voltage is changed in a graph of FIG. 5A. Referring to FIG. 5B, threshold voltage distributions P1 to P7, which are corresponding to first to seventh program states, may overlap with each other. In this case, an error may occur when data stored in a memory cell with overlapping distribution is read.

Figure 5C:
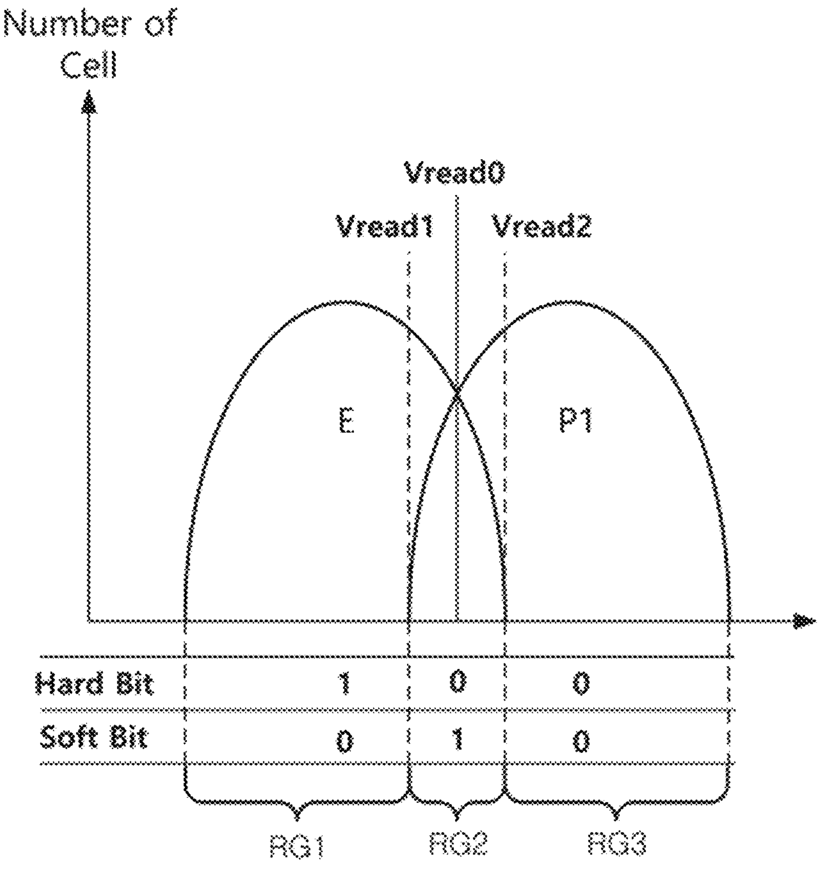
FIG. 5C is a diagram illustrating a hard-bit and a soft-bit when distributions of threshold voltages of memory cells overlap.

FIG. 5C is a diagram illustrating a hard-bit and a soft-bit when distributions of threshold voltages of memory cells storing 1 bit overlap.

FIG. 5C illustrates a case where the threshold voltage distribution 'E' in the erase state of the memory cell overlaps with the threshold voltage distribution P1 in the first program state. When the threshold voltage of the memory cell is present in a first region RG1, a hard-bit may be read as bit '1' with respect to an applied hard read voltage Vread0. When the threshold voltage of the memory cell is in a third region RG3, the hard-bit may be read as bit '0' with respect to the applied hard read voltage Vread0. Since the distributions of each threshold voltage in the first region RG1 and the third region RG3 do not overlap, the reliability of the read hard-bit is high. In contrast, when the threshold voltage of the memory cell is located in a second region RG2, it is unclear whether the corresponding threshold voltage is due to the threshold voltage distribution 'E' in the erase state or the threshold voltage distribution P1 in the first program state. Accordingly, when the threshold voltage of the memory cell is in the second region RG2, the read hard-bit value (bit '0' in FIG. 5C) may have low reliability.

The example of the nonvolatile memory device of FIG. 5C may sense a soft-bit by applying soft read voltages Vread1 and Vread2 that have a certain difference from the hard read voltage Vread0. This application of voltages and corresponding sensing can be referred to as a soft decision process. The memory cell having a threshold voltage lower than the first soft read voltage Vread1 may be identified as bit '1', and the memory cell having a threshold voltage greater than the first soft read voltage Vread1 and less than the second soft read voltage Vread2 may be identified as bit '0'. The memory cell having a threshold voltage greater than the second soft read voltage Vread2 may be identified as bit '1'. The soft-bit may be generated by performing exclusive OR (XOR) of a bit value depending on the on-off state of the memory cell according to the first soft read voltage Vread1 and an inverted value of the bit value depending on the on-off state of the memory cell according to the second soft read voltage Vread2.

The soft-bit may refer to the reliability of the corresponding hard-bit. The soft-bit corresponding to the read hard-bit based on the threshold voltages located in the first region RG1 and the third region RG3 may be called a strong bit. The soft-bit corresponding to the read hard-bit based on the threshold voltage located in the second region RG2 may be called a weak bit. Data composed of a plurality of soft-bits may be called soft-bit data.

Figure 6:
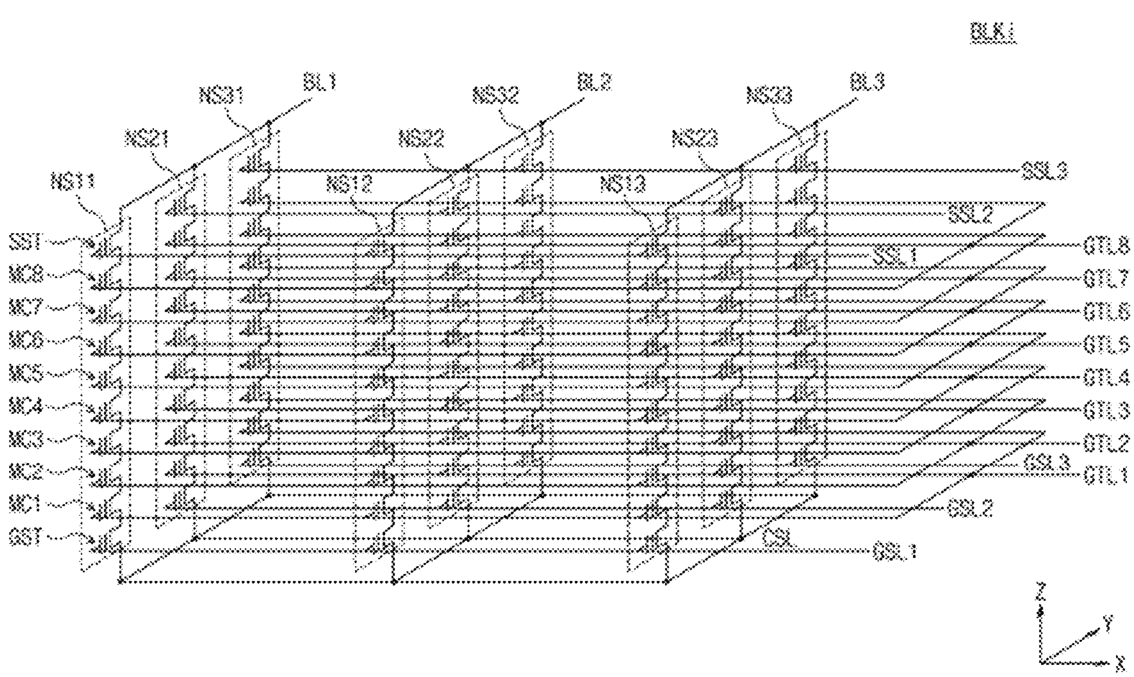
FIG. 6 is a diagram illustrating an example of a memory block of a 3D V-NAND structure applicable to a storage device.

FIG. 6 is a diagram illustrating in detail a memory block of a 3D V-NAND structure applicable to a storage device, according to some implementations of the present disclosure. A memory block BLKi according to the example of FIG. 6 may correspond to any one of the memory blocks BLK_1, BLK_2, . . . of FIG. 4. When the nonvolatile memory device 200 of the storage device 20 of FIGS. 1 and 2 is implemented as a 3D V-NAND type flash memory, each of the plurality of memory blocks forming the nonvolatile memory device 200 may be expressed as an equivalent circuit as illustrated in FIG. 6.

The memory block BLKi illustrated in FIG. 6 represents a three-dimensional (3D) memory block formed in a three-dimensional structure on a substrate. For example, a plurality of memory NAND strings included in the memory block BLKi may be formed in a direction perpendicular to the substrate. The substrate may be parallel to an XY plane. The direction perpendicular to the substrate may be parallel to a Z axis.

Referring to FIG. 6, the memory block BLKi may include a plurality of memory NAND strings NS11 to NS33 connected between the bit lines BL1, BL2, and BL3 and a common source line CSL. Each of the plurality of NAND strings NS11 to NS33 may include a string selection transistor SST, a plurality of memory cells MC1, MC2, . . . , and MC8, and a ground selection transistor GST. In FIG. 6, each of the plurality of memory NAND strings NS11 to NS33 is illustrated as including eight memory cells MC1, MC2, . . . , and MC8, but the present disclosure is not limited thereto.

The string selection transistors SST may be connected to the corresponding string selection lines SSL1, SSL2, and SSL3. The plurality of memory cells MC1, MC2, . . . , and MC8 may be connected to corresponding gate lines GTL1, GTL2, . . . , and GTL8, respectively. The gate lines GTL1, GTL2, . . . , and GTL8 may be used as word lines, some of the gate lines GTL1, GTL2, . . . , and GTL8 may be used as a dummy word line. The ground selection transistors GST may be connected to ground selection lines GSL1, GSL2, and GSL3. The string selection transistors SST may be connected to the corresponding bit lines BL1, BL2, and BL3, and the ground selection transistors GST may be connected to the common source line CSL.

Word lines (e.g., WL1) of the same height may be connected in common, the ground selection lines GSL1, GSL1, and GSL3 may be separated from each other, and the string selection lines SSL1, SSL2, and SSL3 may be separated from each other. In FIG. 6, the memory block BLKi is illustrated as connected to eight gate lines GTL1, GTL2, . . . , and GTL8 and three bit lines BL1, BL2, and BL3, but the present disclosure is not limited thereto.

The memory block BLKi may have different bit densities depending on the number of bits stored by memory cells included in the memory block BLKi.

Figure 7:
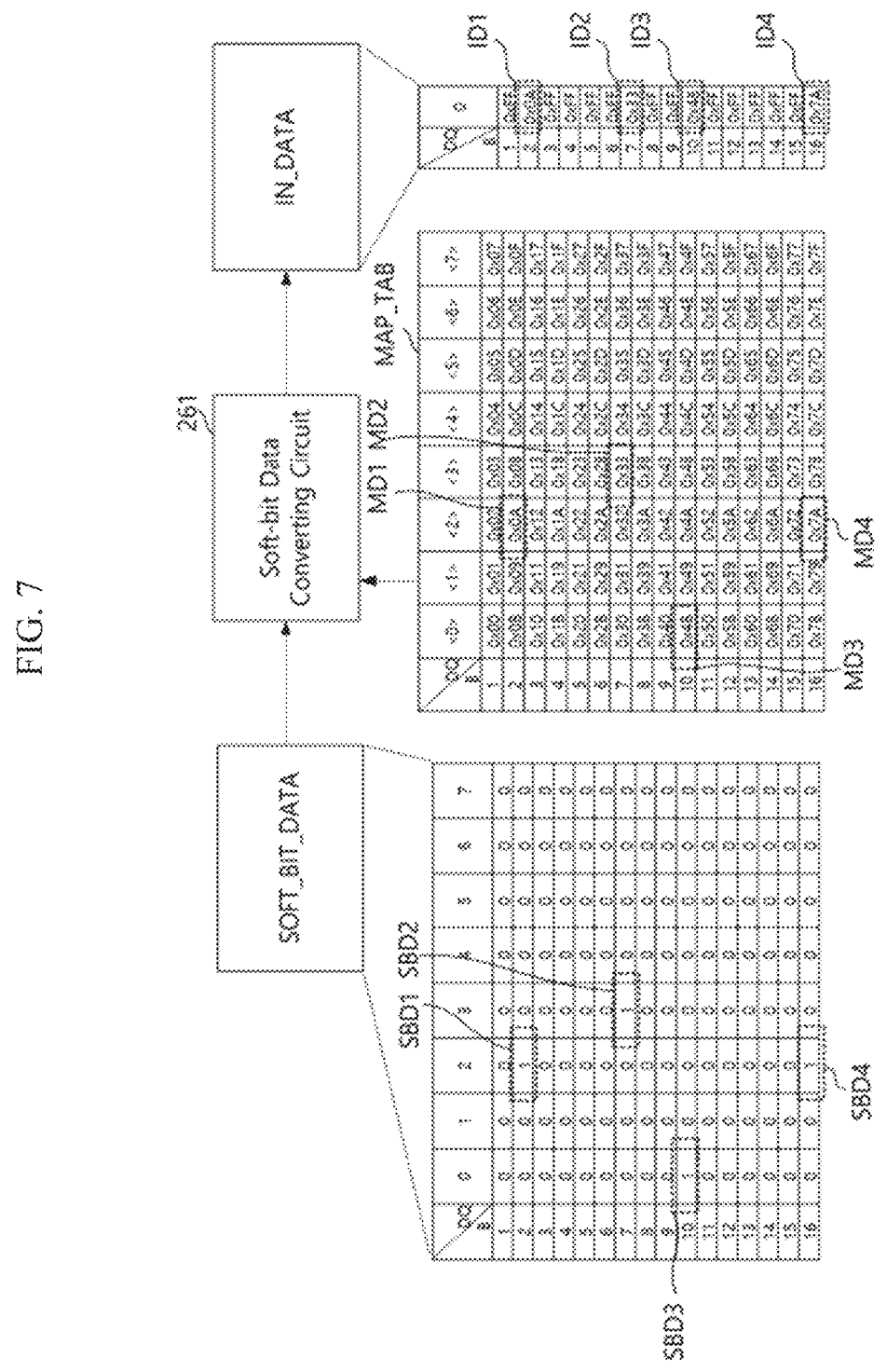

FIG. 7 is a diagram for describing an operation of a soft-bit data converting circuit 261, according to some implementations of the present disclosure. The compression circuit may include the soft-bit data converting circuit 261. The compression circuit including the soft-bit data converting circuit 261 of FIG. 7 may correspond to the compression circuit 260 of FIGS. 1 and 4. For example, the compression circuit 260 can include the soft-bit data converting circuit 261. FIG. 7 describes that each row of input data IN_DATA has one piece of cell data, for purposes of illustration, but the data structure is not limited thereto.

The soft-bit data converting circuit 261 may convert soft-bit data SOFT_BIT_DATA into the input data IN_DATA provided to the plurality of compression stages ST_1, ST_2, . . . of FIGS. 1 and 4.

The soft-bit data SOFT_BIT_DATA may be composed of a plurality of soft-bits sensed by soft decisions. The soft-bit may include the strong bit and the weak bit. Depending on the implementation, the weak bit may be bit '0' or bit '1'. In this specification, it is assumed that the weak bit is bit '1' and the strong bit is bit '0'. The soft-bit data SOFT_BIT_DATA may be of any data size transmitted from the nonvolatile memory device 200 to the controller 100. The soft-bit data SOFT_BIT_DATA in FIG. 7 is illustrated to include four weak bits SBD1 to SBD4.

In some implementations, the soft-bit data SOFT_BIT_DATA HAS a size that is a multiple of the number of data pins of a NAND flash of the nonvolatile memory device 200. For example, the soft-bit data SOFT_BIT_DATA in FIG. 7 may have a size 16 times the number of data pins DQ0 to DQ7. In this case, the soft-bit data SOFT_BIT_DATA may be 128 bits.

The soft-bit data converting circuit 261 may convert the soft-bit data SOFT_BIT_DATA into the input data IN_DATA based on a mapping table MAP_TAB. In some implementations, the number of index codes in the mapping table MAP_TAB is the same as the number of soft-bits in the soft-bit data SOFT_BIT_DATA. Each index code forming the mapping table MAP_TAB may be composed of the index of the corresponding soft-bit in the soft-bit data SOFT_BIT_DATA. For example, each index code forming the mapping table MAP_TAB may be a series of index codes of increasing size. In this case, the position and/or the order of the soft-bit corresponding to the index code in the soft-bit data SOFT_BIT_DATA may be determined from the index code. For example, the index codes of the mapping table MAP_TAB in FIG. 7 sequentially increase by 1 from hexadecimal index codes '0x00' to '0x7F'. Index codes MD1, MD2, MD3, and MD4 of the mapping table MAP_TAB in FIG. 7 correspond to the soft-bits SBD1, SBD2, SBD3, and SBD4 of the soft-bit data SOFT_BIT_DATA, respectively. In this case, the soft-bit SBD1 corresponding to the index code '0x0A' MD1 exists at the 11th position and/or the order in the soft-bit data SOFT_BIT_DATA.

The input data IN_DATA may include a plurality of pieces of cell data and may be composed of a plurality of rows.

In some implementations, the soft-bit data converting circuit 261 converts the soft-bits of each row of the soft-bit data SOFT_BIT_DATA into cell data of each row of the input data IN_DATA. The soft-bit data converting circuit 261 may select the number of soft-bits corresponding to the cell data of each row of the input data IN_DATA from the soft-bits of each row of the soft-bit data SOFT_BIT_DATA, and may generate the input data IN_DATA by preferentially selecting weak bits.

In some implementations, when the weak bit does not exist in a specific row of the soft-bit data SOFT_BIT_DATA, cell data of the corresponding row of the input data IN_DATA may be composed of a dummy code. The dummy code may be code that is not included in the mapping table MAP_TAB. In some implementations, the number of bit digits of the dummy code is the same as the number of bit digits of the index code. Referring to FIG. 7, rows other than the 2nd row, the 7th row, the 10th row, and the 16th row of the soft-bit data SOFT_BIT_DATA do not include the weak bits. Accordingly, the rows other than the 2nd row, the 7th row, the 10th row, and the 16th row of the input data IN_DATA may be composed of dummy codes (0xFF). The cell data of the 2nd row, the 7th row, the 10th row, and the 16th row of the input data IN_DATA may be composed of the index codes of the weak bits of the 2nd row, the 7th row, the 10th row, and the 16th row of the soft-bit data SOFT_BIT_DATA, respectively. For example, referring to FIG. 7, the cell data ID1, ID2, ID3, and ID4 of the 2nd row, the 7th row, the 10th row, and the 16th row of the input data IN_DATA is composed of index codes MD1, MD2, MD3, and MD4 each corresponding to the weak bits SBD1, SBD2, SBD3, and SBD4 of the soft-bit data SOFT_BIT_DATA.

Figure 8:
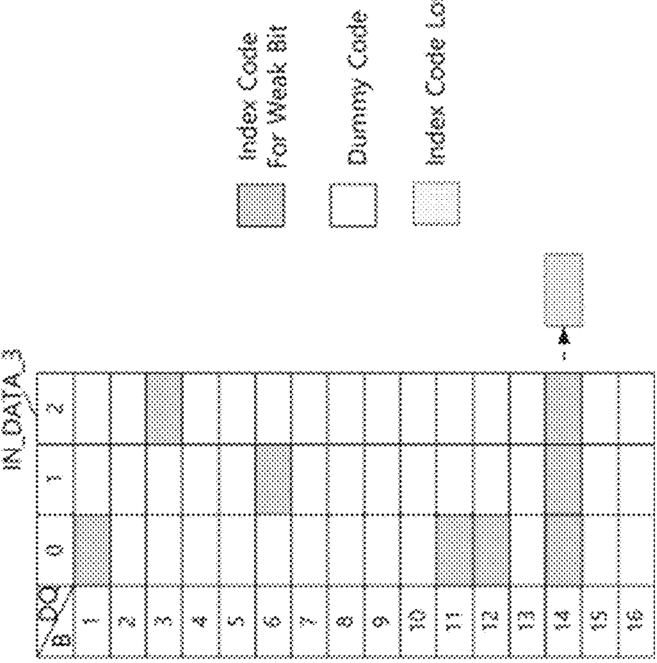
FIG. 8 is a diagram illustrating an example of input data.

FIG. 8 is a diagram for describing the input data IN_DATA, according to some implementations of the present disclosure. Referring to FIG. 8, each row of the input data IN_DATA may include a plurality of pieces of cell data. For example, each row of first input data IN_DATA_1 in the example of of FIG. 7 is composed of one piece of cell data, each row of second input data IN_DATA_2 is composed of two pieces of cell data, and each row of third input data IN_DATA_3 is composed of three pieces of cell data. When the number of weak bits in the corresponding row of the soft-bit data SOFT_BIT_DATA is less than the number of cell data in the row of the input data IN_DATA, the remaining cell data other than the cell data corresponding to the weak bits may be composed of dummy codes. When the number of weak bits in the corresponding row of the soft-bit data SOFT_BIT_DATA is greater than the number of cell data in the row of the input data IN_DATA, some index codes corresponding to the weak bits may be discarded. For example, when there are four weak bits in the 14th row of the soft-bit data SOFT_BIT_DATA corresponding to the 14th row of the third input data IN_DATA_3, one weak bit may be discarded.

Figure 9:
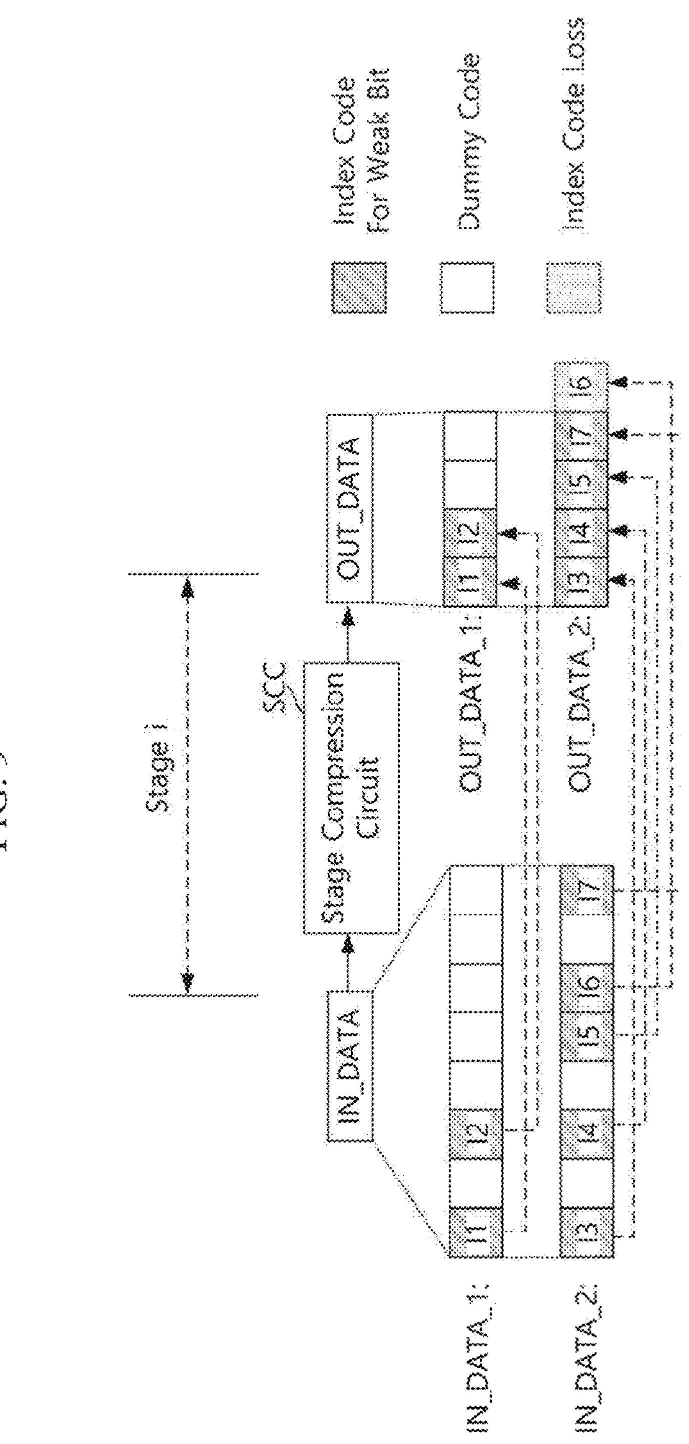
FIG. 9 is a diagram illustrating an example of operation of a stage compression circuit.

FIG. 9 is a diagram illustrating a stage compression circuit SCC, according to some implementations of the present disclosure. The stage compression circuit SCC of FIG. 9 may include at least one compression stage 'stage i' among the plurality of compression stages ST_1, ST_2, . . . of FIGS. 1 and 4.

Referring to FIG. 9, the stage compression circuit SCC may generate the output data OUT_DATA by compressing the input data IN_DATA. For example, the stage compression circuit SCC may compress the input data IN_DATA_1 and IN_DATA_2 to generate the output data OUT_DATA_1 and OUT_DATA_2, respectively. The input data IN_DATA may correspond to the input data IN_DATA of FIG. 7. The input data IN_DATA and the output data OUT_DATA include a plurality of pieces of cell data, and each of the cell data may be composed of one of an index code or a dummy code.

The stage compression circuit SCC may compress the input data IN_DATA based on a preset stage compression ratio. For example, the stage compression circuit SCC of FIG. 9 may compress the input data IN_DATA with 8 cell data based on a stage compression ratio of 2:1 to generate the output data OUT_DATA with four pieces of cell data.

The stage compression circuit SCC may generate the output data OUT_DATA by selecting at least one piece of cell data among the plurality of pieces of cell data of the input data IN_DATA. The stage compression circuit SCC may select the same number of cell data as the number of cell data (the number corresponding to the stage compression ratio) of the output data OUT_DATA from among the plurality of pieces of cell data of the input data IN_DATA. In some implementations, the stage compression circuit SCC generates the output data OUT_DATA by preferentially selecting an index code from the cell data of the input data IN_DATA.

Referring to FIG. 9, among the cell data of the input data IN_DATA_1, cell data including index codes I1 and I2 are each selected as cell data of the output data OUT_DATA_1. The remaining cell data of the output data OUT_DATA_1 are composed of dummy codes. In addition, the cell data including index codes I3, I4, I5, and I7 among the cell data of the input data IN_DATA_2 are selected as the cell data of the output data OUT_DATA_2. The index code I6 exceeding the number of cell data of the output data OUT_DATA_2 may be discarded. A method by which the stage compression circuit SCC selects at least one piece of the cell data among the plurality of pieces of cell data of the input data IN_DATA will be described below with reference to FIGS. 11 and 12.

The stage compression circuit SCC according to some implementations generates the output data OUT_DATA by selecting at least one piece of cell data among the plurality of pieces of cell data of input data IN_DATA. However, since the stage compression circuit SCC preferentially selects the index code, the input data IN_DATA and the output data OUT_DATA may include at least one same index code. The same index code may be included even when a plurality of stage compression circuits are connected in series or the same stage compression circuit repeatedly performs compression. Accordingly, the input data and output data of the compression circuit 260 composed of the plurality of stages may include at least one same index code. When this is expressed as bit data, the input data and the output data of the compression circuit 260 may include at least some of the same bit sequence. The number of bit digits of the same bit sequence may be a multiple (including multiples of 1) of the number of bit digits of the index code.

Figure 10:
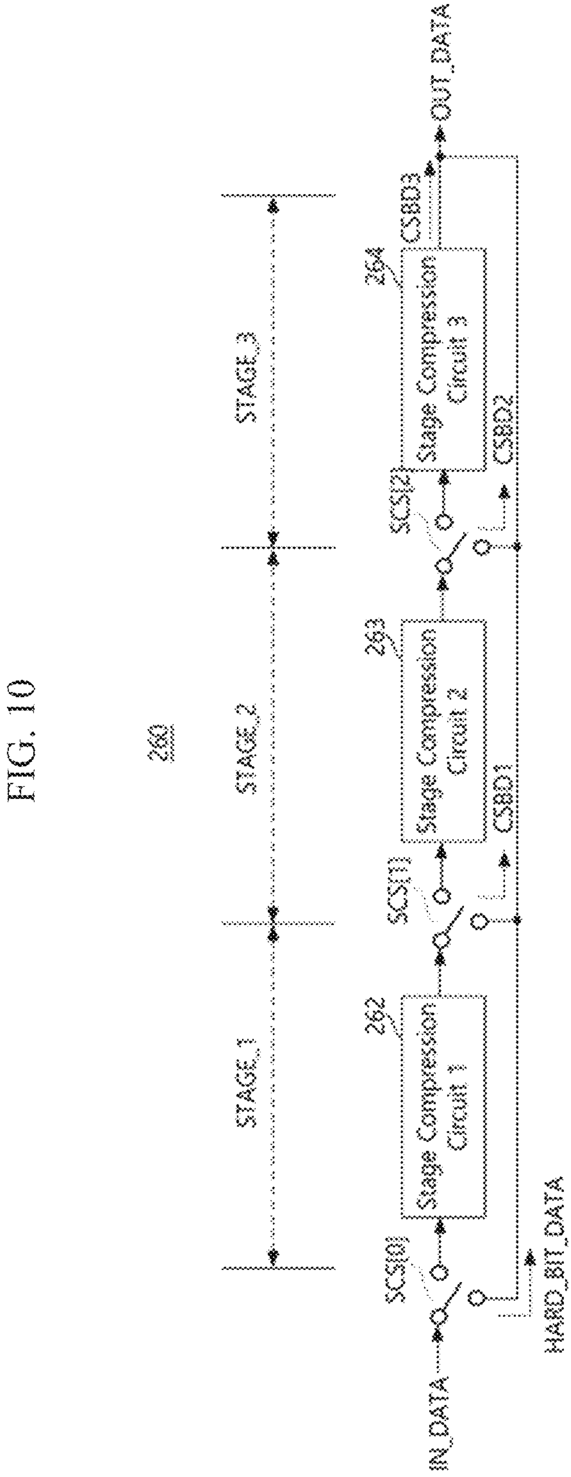
FIG. 10 is a diagram illustrating an example of operation of a plurality of compression stages of a compression circuit.

FIG. 10 is a diagram illustrating a plurality of compression stages of a compression circuit, according to some implementations of the present disclosure. The compression circuit 260 of FIG. 10 may correspond to the compression circuit 260 of FIG. 1 and FIG. 4. FIG. 10 illustrates that the compression circuit 260 is composed of three compression stages STAGE_1, STAGE_2, and STAGE_3 and includes three stage compression circuits 262, 263, and 264 by way of example. However, the compression circuit 260 may be composed of more or fewer compression stages, or may include more or fewer stage compression circuits.

Referring to FIG. 10, in the compression circuit 260, each of the plurality of compression stages STAGE_1, STAGE_2, and STAGE_3 may be performed by each of the plurality of stage compression circuits 262, 263, and 264. For example, the first compression stage STAGE_1 may be performed by the first stage compression circuit 262, the second compression stage STAGE_2 may be performed by the second stage compression circuit 263, and the third compression stage STAGE_3 may be performed by the third stage compression circuit 264.

Each of the plurality of stage compression circuits 262, 263, and 264 corresponding to each of the plurality of compression stages STAGE_1, STAGE_2, and STAGE_3 may compress the input data based on the stage compression ratio. The stage compression ratio of each of the plurality of compression stages STAGE_1, STAGE_2, and STAGE_3 may be the same or different from each other. For example, each of the stage compression circuits 262, 263, and 264 may compress the input data based on the same or different stage compression ratios.

The compression ratio of the soft-bit data SBD may be achieved by compression in each of the plurality of compression stages STAGE_1, STAGE_2, and STAGE_3. For example, when all of the plurality of compression stages STAGE_1, STAGE_2, and STAGE_3 perform compression based on the stage control signal SCS, a value given by the multiple of the stage compression ratios of each of the plurality of compression stages STAGE_1, STAGE_2, and STAGE_3 may be the compression ratio of the compression circuit 260.

In some implementations (for example, when the compression circuit 260 includes the plurality of stage compression circuits and when the plurality of stage compression circuits are connected in series and have a structure in which the output data of one stage compression circuit is provided to another stage compression circuit), the input and output between the plurality of stage compression circuits may be controlled by the stage control signal. For example, referring to FIG. 10, the output data of the first stage compression circuit 262 may or may not be provided to the second stage compression circuit 263 based on a stage control signal SCS[1] provided by the control logic circuit 210 of FIGS. 1 and 4. The output data of the second stage compression circuit 263 may or may not be provided to the third stage compression circuit 264 based on a stage control signal SCS[2].

In some implementations, the plurality of compression stages STAGE_1, STAGE_2, and STAGE_3 sequentially perform compression. When one compression stage does not perform compression, compression stages following that compression stage may also not perform compression. For example, when the stage control signal SCS[1] is a signal that causes the output data of the first stage compression circuit 262 not to be provided to the second stage compression circuit 263, the stage control signal SCS[2] may also be a signal that causes the output data of the second stage compression circuit 263 not to be provided to the third stage compression circuit 264. Accordingly, the output data of the first stage compression circuit 262 is output as compressed soft-bit data CSBD1. As in the above description, when stage control signals SCS[0] and SCS[1] are control signals that provide the input data to the corresponding stage compression circuits 262 and 263, and when the stage control signal SCS[2] is a control signal that controls not to provide the input data to the corresponding stage compression circuit 264, the output data of the second stage compression circuit 263 is output as compressed soft-bit data CSBD2. When the stage control signals SCS[0], SCS[1], and SCS[2] are control signals that provide input data to the corresponding stage compression circuits 262, 263, and 264, the output data of the third stage compression circuit 264 is output as compressed soft-bit data CSBD3.

In some implementations, hard-bit data HARD_BIT_DATA is not compressed in the plurality of compression stages STAGE_1, STAGE_2, and STAGE_3 by the stage control signal SCS[0] (not provided to the stage compression circuits 262, 263, 264) and may be output as the output data OUT_DATA of the compression circuit 260.

Figure 11:
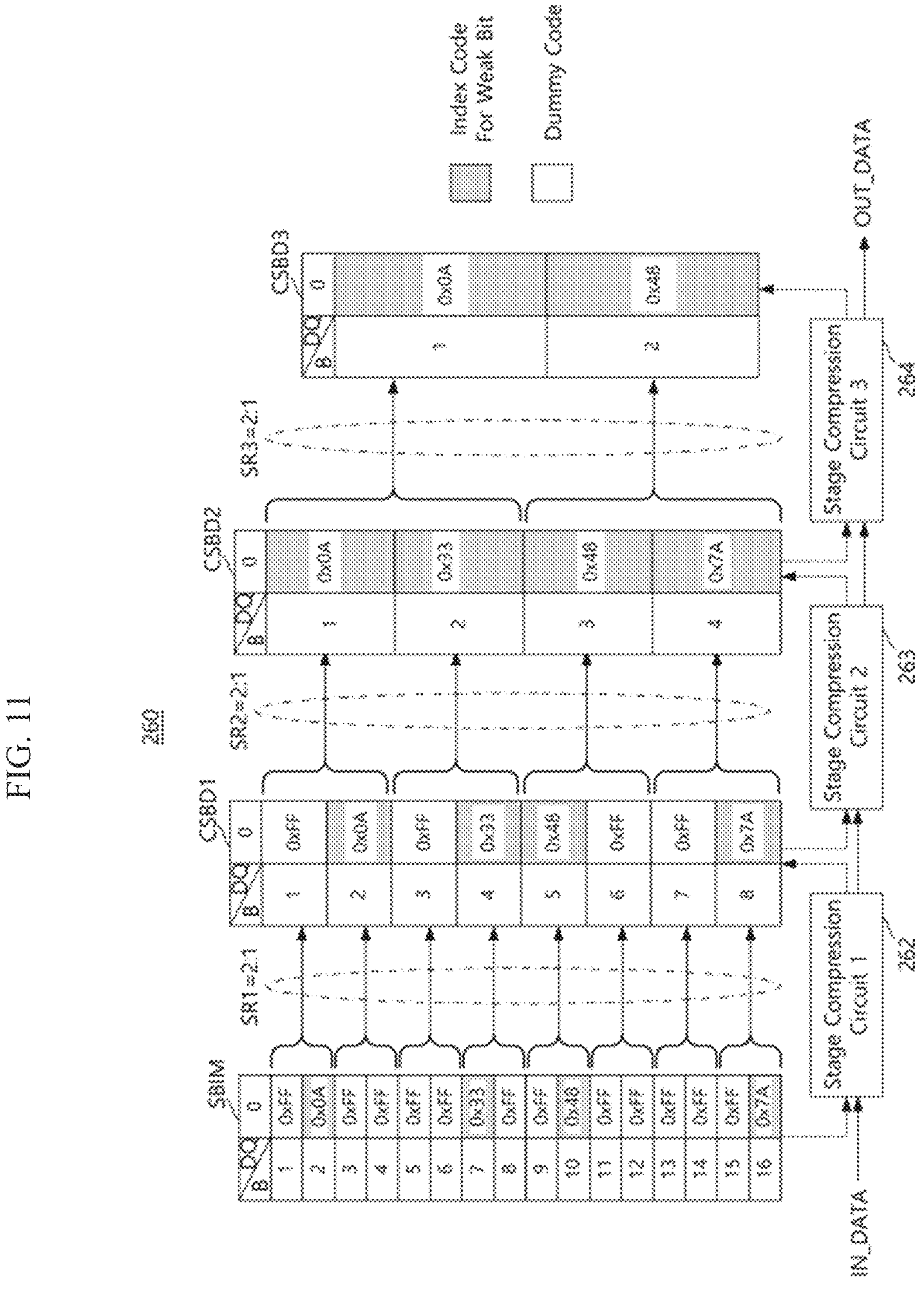
FIG. 11 is a diagram illustrating an example of compression by a plurality of stage compression circuits of a compression circuit.

FIG. 11 is a diagram illustrating compression in a plurality of stage compression circuits of a compression circuit according to some implementations of the present disclosure compress. The stage compression circuits 262, 263, and 264 of FIG. 11 may correspond to the stage compression circuit SCC of FIG. 9 and the stage compression circuits 262, 263, and 264 of FIG. 10. The compression circuit 260 of FIG. 11 may correspond to the compression circuit 260 of FIGS. 1, 4, and 10. A description will be given assuming that, based on the stage control signal, all of the stage compression circuits 262, 263, and 264 of the compression circuit 260 perform compression based on the same stage compression ratio (SR1=SR2=SR3=2:1). However, in some implementations, only some of the stage compression circuits 262, 263, and 264 perform compression based on the stage control signal, and the output data of any one stage compression circuit may be output as output data OUT_DATA of the compression circuit 260. For example, the output data of any stage compression circuit may be output as compressed soft-bit data.

Referring to FIG. 11, the compression circuit 260 may include the plurality of stage compression circuits 262, 263, and 264. The first stage compression circuit 262 may receive the input data IN_DATA obtained by converting the soft-bit data SOFT_BIT_DATA using the soft-bit data converting circuit 261 of FIG. 7. The input data IN_DATA in FIG. 11 include 4 pieces of the cell data composed of index codes and 12 pieces of cell data composed of dummy codes, as an example.

Each of the first stage compression circuit 262, the second stage compression circuit 263, and the third stage compression circuit 264 may select one out of each two pieces of the cell data (being referred to as split input data) of the input data provided to each stage compression circuit based on each of the first stage compression ratio (SR1=2:1), the second stage compression ratio (SR2=2:1), and the third stage compression ratio (SR3=2:1), to generate one piece of the cell data of each of a first compressed soft-bit data CSBD1, a second compressed soft-bit data CSBD2, and a third compressed soft-bit data CSBD3. The first stage compression circuit 262 may compress the input data IN_DATA to generate the first compressed soft-bit data CSBD1, and the second stage compression circuit 263 may compress the first compressed soft-bit data CSBD1 to generate the second compressed soft-bit data CSBD2, and the third stage compression circuit 264 may compress the second compressed soft-bit data CSBD2 to generate the third compressed soft-bit data CSBD3. Each of the first stage compression circuit 262, the second stage compression circuit 263, and the third stage compression circuit 264 may preferentially select cell data composed of an index code among the cell data of the provided input data. Moreover, in some implementations, when there are a plurality of pieces of cell data composed of index codes, cell data having a smaller index code may be selected first. In some implementations, when there are a plurality of pieces of cell data composed of index codes, the cell data with a larger index code may be selected first.

Each of the first stage compression circuit 262, the second stage compression circuit 263, and the third stage compression circuit 264 may select and compress the cell data of the provided input data based on each of the first stage compression ratio (SR1=2:1), the second stage compression ratio (SR2=2:1), and the third stage compression ratio (SR3=2:1). As a result, the third compressed soft-bit data CSBD3 may be output as the output data OUT_DATA of the compression circuit 260. Therefore, the compression ratio of the compression circuit 260 with respect to the input data IN_DATA is 8:1 (=12.5%), which is the product of the first stage compression ratio (SR1=2:1), the second stage compression ratio (SR2=2:1), and the third stage compression ratio (SR3=2:1). When the first compressed soft-bit data CSBD1, which is the output data of the first stage compression circuit 262, is output as the output data OUT_DATA of the compression circuit 260, the compression ratio of the compression circuit 260 is 2:1 (=50%). In addition, when the second compressed soft-bit data CSBD2, which is the output data of the second stage compression circuit 263, is output as the output data OUT_DATA of the compression circuit 260, the compression ratio of the compression circuit 260 is 4:1 (=25%). Accordingly, the control logic circuit 210 of FIGS. 1 and 4 may achieve the target compression ratio (e.g., 50%, 25%, or 12.5%) by transmitting a suitable corresponding stage control signal that controls whether compression on each stage compression circuit is performed.

The ECC block 170 of the controller 100 of FIGS. 1 and 4 may extract the index code from the compressed soft-bit data. The ECC block 170 may generate the soft-bit data based on the mapping table MAP_TAB of FIG. 7 and the compression ratio. For example, when decompressing the third compressed soft-bit data CSBD3, the soft-bit data may be generated by extracting the index codes ‘0x0A’ and ‘0x48’ from the third compressed soft-bit data CSBD3, and by adding weak bits to positions corresponding to the index codes ‘0x0A’ and ‘0x48’ in the soft-bit data equal to the size of the mapping table MAP_TAB. In some implementations, the number of 16 rows of soft-bit data may be determined by multiplying the number of extracted index codes by the compression ratio (8:1), and the number of 8 columns of soft-bit data may be determined based on the number of data pins DQ. The ECC block 170 may generate the soft-bit data by adding weak bits to positions corresponding to the index codes ‘0x0A’ and ‘0x48’ in the soft-bit data of which the size is determined.

Figure 12:
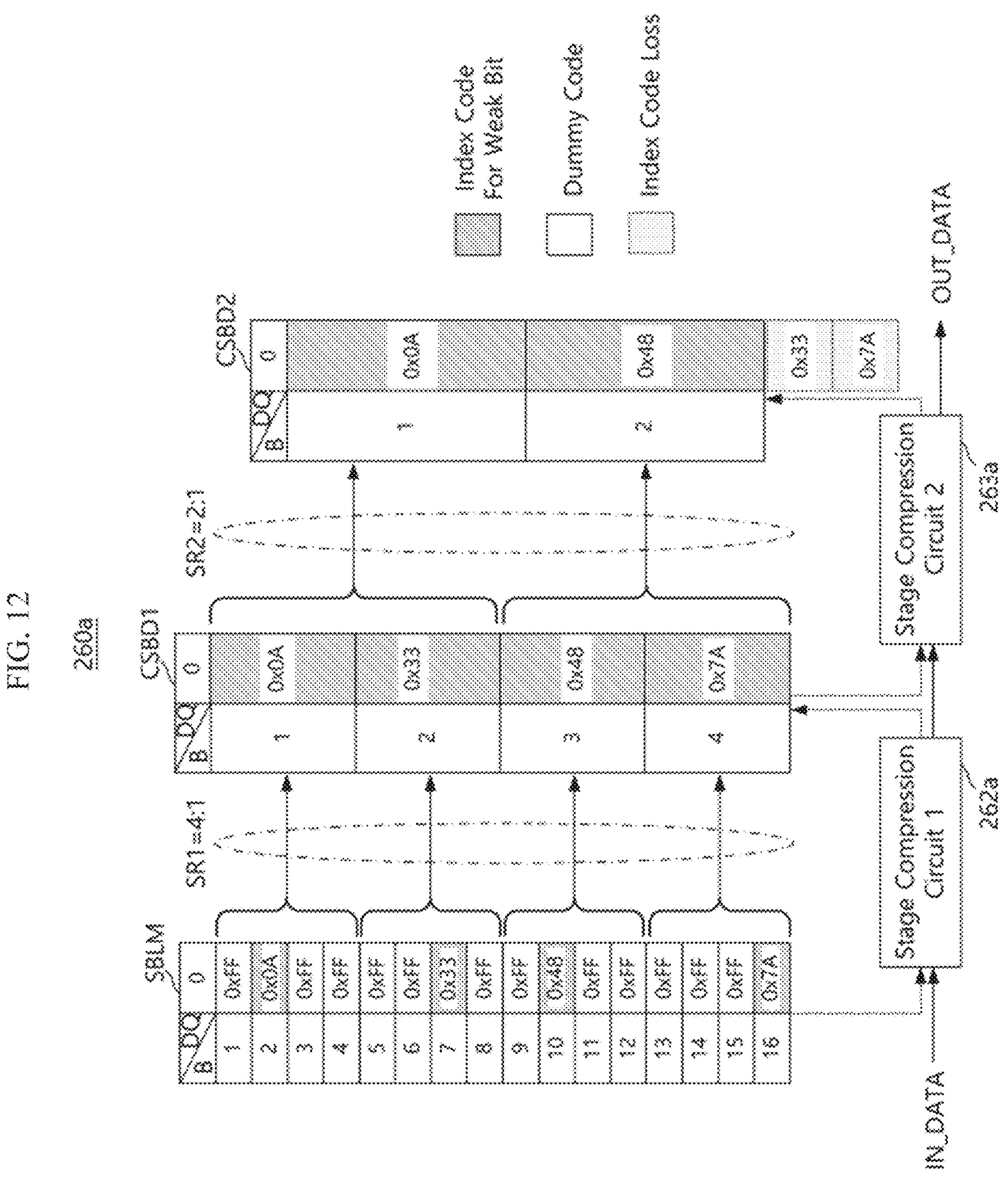
FIG. 12 is a diagram illustrating an example of compression by a plurality of stage compression circuits of a compression circuit.

FIG. 12 is a diagram illustrating another example of compression by a plurality of stage compression circuits of a compression circuit. Stage compression circuits 262*a* and 263*a* of FIG. 12 may correspond to the stage compression circuit SCC of FIG. 9. A compression circuit 260*a* of FIG. 12 may correspond to the compression circuit 260 of FIGS. 1, 4, and 10. Additional descriptions of elements or characteristics that are the same as or similar to the corresponding elements or characteristics of FIG. 11 will be omitted to avoid redundancy, and can equally be applied to FIG. 12 except where noted otherwise or suggested otherwise by context.

Referring to FIG. 12, the compression circuit 260*a* includes two stage compression circuits 262*a* and 263*a*, and each of the stage compression circuits 262*a* and 263*a* performs compression based on different stage compression ratios (SR1=4:1 and SR2=2:1) in response to the stage control signal.

The input data IN_DATA including 4 pieces of the cell data composed of the index codes of FIGS. 12 and 12 pieces of the cell data composed of dummy codes are provided to the first stage compression circuit 262*a*. The first stage compression circuit 262*a* selects one out of each four pieces of the cell data of the input data IN_DATA based on the first stage compression ratio (SR1=4:1) to generate the cell data of the first compressed soft-bit data CSBD1. The first stage compression circuit 262*a* may preferentially select cell data composed of the index codes among the cell data of the input data IN_DATA. For example, referring to FIG. 12, the cell data of the second row composed of the index codes is selected among the cell data of the first to fourth rows of the input data IN_DATA, and the cell data of the first row of the first compressed soft-bit data CSBD1 is generated. The first compressed soft-bit data CSBD1 may be generated by selecting the cell data of the 7th row, the cell data of the 10th row, and the cell data of the 16th row in the same manner with respect to the remaining cell data (the cell data of the 5th row to the 16th row) of the input data IN_DATA.

As in the above description, the second stage compression circuit 263*a* may also compress the first compressed soft-bit data CSBD1 to generate the second compressed soft-bit data CSBD2. The second stage compression circuit 263*a* selects one out of each two pieces of the cell data of the first compressed soft-bit data CSBD1 based on the second stage compression ratio (SR2=2:1) to generate the cell data of the second compressed soft-bit data CSBD2. Among the cell data of the first to fourth rows of the input data IN_DATA, the cell data of the second row composed of the index codes is selected and the cell data of the first row of the first compressed soft-bit data CSBD1 is generated. For example, referring to FIG. 12, any one of the cell data of the first row to the second row of the first compressed soft-bit data CSBD1 is generated as the cell data of the first row of the second compressed soft-bit data CSBD2. In this case, in FIG. 12, all cell data of the first row to the second row of the first compressed soft-bit data CSBD1 are composed of the index codes. Accordingly, in this case, the second stage compression circuit 263*a* may select the cell data of the first row with a small index code. Likewise, the cell data of the third row may be selected from among the cell data of the third to fourth rows, which are all composed of index codes. As a result, the cell data of the second row and the fourth row are not included in the second compressed soft-bit data CSBD2 and are lost. In this case, it will be understood that lossy compression is performed.

As confirmed in the examples of FIGS. 11 and 12, the index codes included in the input data IN_DATA and the output data OUT_DATA provided to the compression circuit may be increased or decreased in the same way as the mapping table MAP_TAB. Therefore, when the index code increases, and when the index code of any cell data of the input data IN_DATA and the output data OUT_DATA is the last index code of the mapping table MAP_TAB, the cell data after the corresponding cell data do not include the index code. The ECC block 170 may stop extracting the index code from the compressed soft-bit data CSBD when the index code extracted from the compressed soft-bit data CSBD is the last index code in the mapping table MAP_TAB.

Additionally, since the compression circuit generates the output data by selecting at least one piece of cell data from among the cell data of the input data, the compression may be performed independent of the bit configuration of the input data. Therefore, since the compression load of the compression circuit is low, compression may be performed efficiently.

Figure 13:
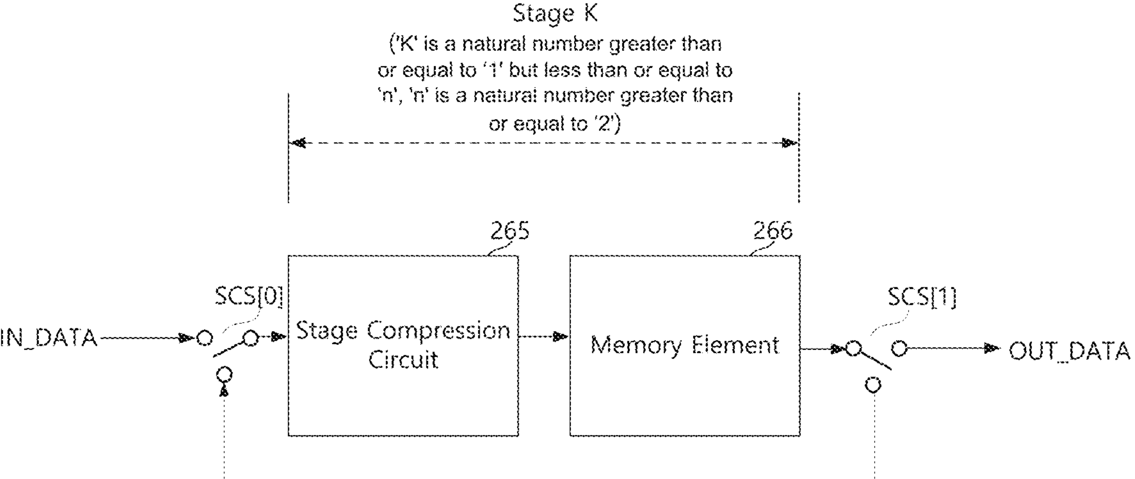
FIG. 13 is a diagram illustrating an example of operation of a compression circuit.

FIG. 13 is a diagram illustrating a plurality of compression stages of a compression circuit, according to some implementations of the present disclosure. A compression circuit 260*b* of FIG. 13 may correspond to the compression circuit 260 of FIG. 1 or FIG. 4. FIG. 13 illustrates an example in which the compression circuit 260*b* includes one stage compression circuit 265. Additional descriptions of the same or similar elements or characteristics as the compression circuits described with respect to FIGS. 7 to 12 will be omitted to avoid redundancy, and can equally be applied to FIG. 13 except where noted otherwise or suggested otherwise by context.

Referring to FIG. 13, in order for the compression circuit 260 to perform compression based on the plurality of stages, the output of the stage compression circuit 265 is stored in a storage element 266, and then may again be provided to the stage compression circuit 265 based on the stage control signals SCS[0] and SCS[1]. The stage control signals SCS [0] and SCS[1] may be based on stage number. Accordingly, one stage or multiple stages of compression may be performed.

Figure 14:
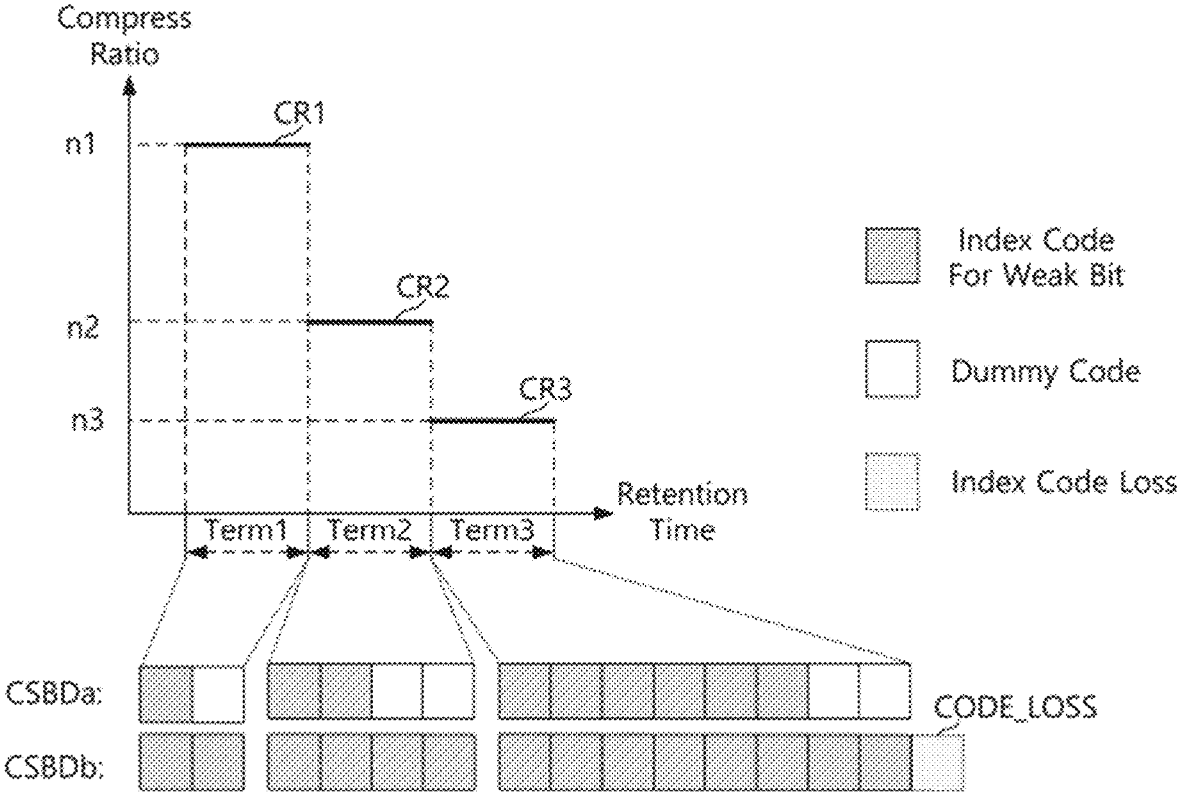
FIG. 14 is a diagram illustrating an example of a change in a compression ratio of a storage device.

FIG. 14 is a diagram illustrating a change in a compression ratio of a storage device, according to some implementations of the present disclosure. The compression ratio change in FIG. 14 may be performed in the storage device 20 of FIGS. 1 to 13.

Referring to FIG. 14, the storage device 20 may change the compression ratio of the soft-bit data such that the compression circuits 260, 260*a*, and 260*b* compress the soft-bit data with a first compression ratio CR1 in a first period Term1, compress the soft-bit data with a second compression ratio CR2 in a second period Term2, and compress the soft-bit data with a third compression ratio CR3 in a third period Term3. The second period Term2 may be a period after the first period Term1, the second compression ratio CR2 may be lower than the first compression ratio CR1, and the third compression ratio CR3 may be lower than the second compression ratio CR2. As time progresses from the first period Term1 to the third period Term3, it may be seen that the number of cell data of compressed soft-bit data CSBDa, and CSBDb provided to the controller 100 increases. As the time progresses from the first period Term1 to the third period Term3, the retention time of the storage device 20 may increase and/or the remaining lifespan may decrease.

In some implementations, the first compression ratio CR1, the second compression ratio CR2, and the third compression ratio CR3 may be set in advance. For example, whether and/or when the compression ratio is changed may be determined by the controller 100 based on at least one of the retention time of the storage device 20, the remaining lifespan of the nonvolatile memory device 200, the occurrence of wear out, the failure rate of the error correction decoding, the failure rate of the hard decoding, the failure rate of the soft decoding, and/or the error bit rate. Alternatively, or in addition, whether and/or when the compression ratio is changed may be determined by the control logic circuit 210 based on at least one of the ratio and/or number of weak bits of the soft-bit data SBD, the tendency of the weak bits to increase, etc.

Figure 15:
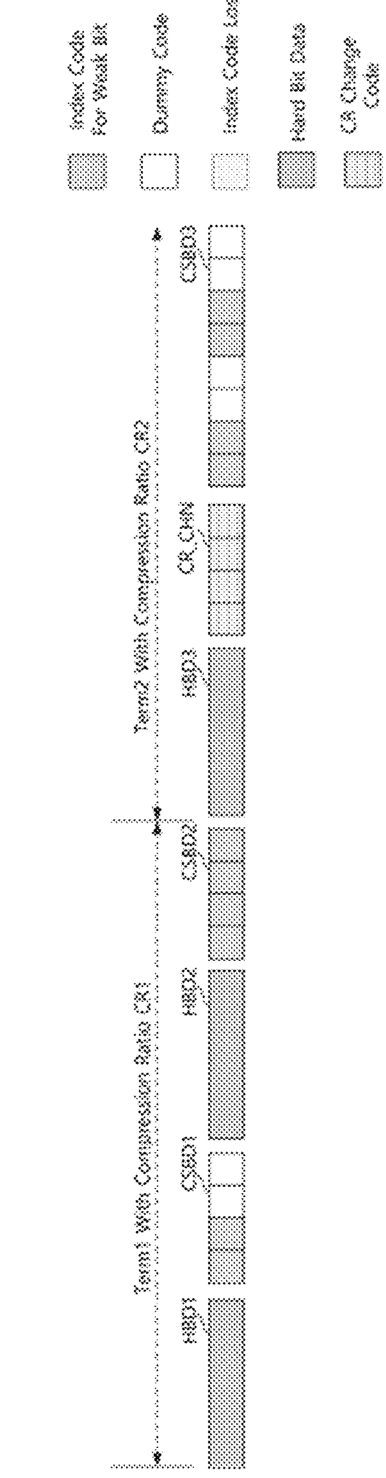
FIG. 15 is a diagram illustrating an example of a method by which a nonvolatile memory device provides a compression ratio change signal to a controller.

FIG. 15 is a diagram illustrating a method by which a nonvolatile memory device provides a compression ratio change signal to a controller, according to some implementations of the present disclosure. The compression ratio change signal of FIG. 15 may be provided to the controller 100 by the nonvolatile memory device 200 of FIGS. 1 to 14.

The nonvolatile memory device 200 may compress the soft-bit data at the first compression ratio CR1 in the first period Term1 and may compress the soft-bit data at the second compression ratio CR2 in the second period Term2. The first compression ratio CR1 and the second compression ratio CR2 may be set in advance. The second compression ratio CR2 may be lower than the first compression ratio CR1, and the second period Term2 may be a period after the first period Term1.

After transmitting hard-bit data HBD1, HBD2, and HBD3 respectively, or simultaneously, the nonvolatile memory device 200 may transmit the compressed soft-bit data CSBD1, CSBD2, and CSBD3 corresponding to each of the hard-bit data HBD1, HBD2, and HBD3. The compressed soft-bit data CSBD1 and CSBD2 may be data compressed based on the first compression ratio CR1, and the compressed soft-bit data CSBD3 may be data compressed based on the second compression ratio CR2.

The compression ratio of the soft-bit data may be changed depending on a request from the controller 100 or a determination of the nonvolatile memory device 200. In this case, the nonvolatile memory device 200 may transmit the compression ratio change signal CR_CHN composed of compression ratio change codes to the controller 100 before transmitting the compressed soft-bit data CSBD3 based on the changed compression ratio CR2. The compression ratio change signal CR_CHN may include the same number of cell data as the soft-bit data CSBD1 compressed at the first compression ratio CR1. The compression ratio change code may be a code (e.g., not an index code) that is not included in the mapping table MAP_TAB of FIG. 7 and may be a code that is not a dummy code. The compression ratio change code may be a code that has the same number of bit digits as the index code and the dummy code. The compression ratio change code may be preset or may not be preset depending on the implementation.

When the compression ratio change code is not set in advance, and when the same number of cell data as the compressed soft-bit data CSBD1 is composed of a code that is not included in the mapping table MAP_TAB and is not a dummy code, the controller 100 may determine that the compression ratio is lowered by one level. When the compression ratio change code is preset, it may be determined that the compression ratio is lowered by one step in correspondence with reception of the compression ratio change signal CR_CHN composed of the preset compression ratio change codes.

In some implementations, a plurality of different codes may be used as the compression ratio change codes. In this case, each time the compression ratio is changed (i.e., each time the compression ratio is lowered again), the compression ratio change signal CR_CHN composed of a new compression ratio change codes may be transmitted to the controller 100.

Figure 17:
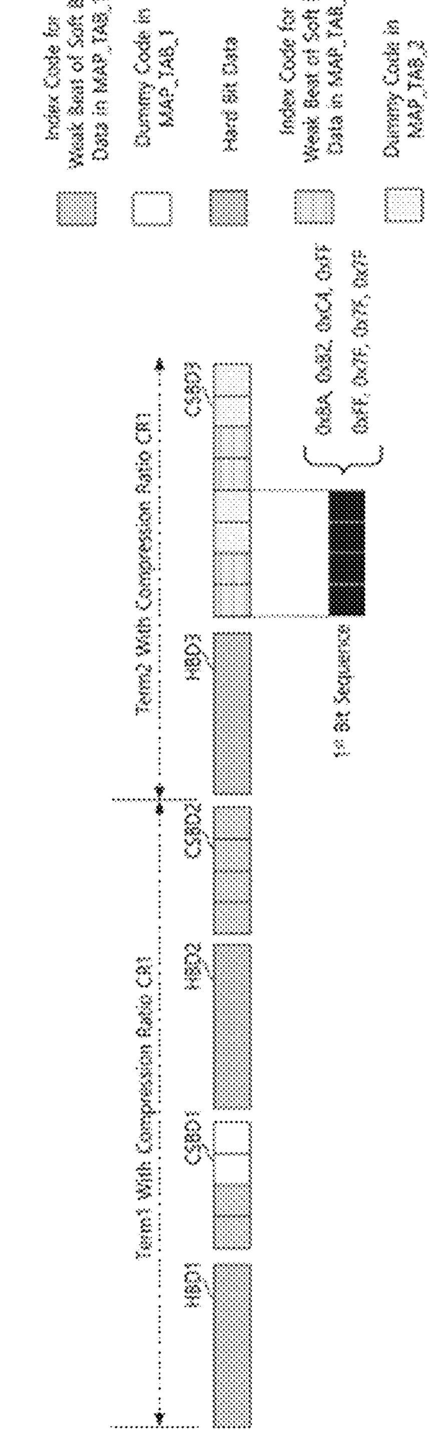

FIGS. 16 and 17 are diagrams illustrating a method by which a nonvolatile memory device provides a compression ratio change signal to a controller, according to some implementations of the present disclosure. The compression ratio change signals of FIGS. 16 and 17 may be provided to the controller 100 by the nonvolatile memory device 200 of FIGS. 1 to 14.

The nonvolatile memory device 200 may compress the soft-bit data SBD at the first compression ratio CR1 in the first period Term1, and may compress the soft-bit data SBD at the second compression ratio CR2 in the second period Term2. The first compression ratio CR1 and the second compression ratio CR2 may be set in advance. The second compression ratio CR2 may be lower than the first compression ratio CR1, and the second period Term2 may be a period after the first period Term1.

Referring to FIG. 16, the nonvolatile memory device 200 may perform compression on the soft-bit data SBD based on a first mapping table MAP_TAB_1 in correspondence with the first compression ratio CR1, and may perform compression on the soft-bit data SBD based on a second mapping table MAP_TAB_2 in correspondence with the second compression ratio CR2. In compression based on the first mapping table MAP_TAB_1, a last index code '0xFF' of the second mapping table MAP_TAB_2 may be used as the dummy code, and in compression based on the second mapping table MAP_TAB_2, the last index code '0x7F' of the first mapping table MAP_TAB_1 may be used as the dummy code.

Referring to FIG. 17, after transmitting the hard-bit data HBD1, HBD2, and HBD3 respectively, or simultaneously, the nonvolatile memory device 200 may transmit the compressed soft-bit data CSBD1, CSBD2, and CSBD3 corresponding to each of the hard-bit data HBD1, HBD2, and HBD3. The compressed soft-bit data CSBD1 and CSBD2 may be data compressed based on the first compression ratio CR1, and the compressed soft-bit data CSBD3 may be data compressed based on the second compression ratio CR2.

The controller 100 may determine the change from the first compression ratio CR1 to the second compression ratio CR2 based on a bit configuration of a first bit sequence of a size (e.g., 4 pieces of the cell data in FIG. 17) corresponding to the first compression ratio CR1 from the compressed soft-bit data CSBD1, CSBD2, and CSBD3.

For example, the controller 100 may identify the codes of 4 pieces of the cell data in correspondence with the first compression ratio CR1 in the third compressed soft-bit data CSBD3 received at specific time after the compressed soft-bit data CSBD1 and CSBD2 based on the first compression ratio CR1. In a first case, when at least some of the codes of the 4 pieces of the cell data are index codes 0x80 to 0xFE of the second mapping table MAP_TAB_2, it may be determined that the compression ratio is changed. In a second case, when the codes of the 4 pieces of the cell data are '0xFF, 0x7F, 0x7F, and Ox7F', it may be determined that the compression ratio is changed. In this case, the code '0xFF' may be a dummy code used in compression based on the first compression ratio CR1 or the last index code indicating a weak bit used in compression based on the second compression ratio CR2. When the code '0xFF' is the index code used in compression based on the second compression ratio CR2, the code '0xFF' is the last index code indicating a weak bit, so no index code may come thereafter. Additionally, when the code '0xFF' is the dummy code used in compression based on the first compression ratio CR1, the next three codes that are different from '0xFF' should be dummy codes, so the same code may be repeated. Therefore, when the codes of the 4 pieces of the cell data are '0xFF, 0x7F, 0x7F, and 0x7F', it may be determined that the compression ratio is changed.

As another example, the controller 100 may identify the codes of 2 pieces of the cell data in the fourth compressed soft-bit data received at specific time after the compressed soft-bit data CSBD1 and CSBD2 based on the first compression ratio CR1. In the first case, when the codes of the 2 pieces of the cell data are different from each other and are index codes 0x00 to 0x7F of the first mapping table MAP_TAB_1, it may be determined that the compression ratio is maintained. In the second case, when the codes of the 2 pieces of the cell data are '0xFF and 0xFF', respectively, it may be determined that the compression ratio is maintained. When the compression ratio is changed and compression is performed based on the second mapping table MAP_TAB_2, the code '0xFF' is the index code of the second mapping table MAP_TAB_2, so the index code may not be duplicated. Accordingly, the controller 100 may determine that the compression ratio is maintained.

FIG. 18 is a diagram for illustrating a method of operation of a storage device, according to some implementations of the present disclosure. The method may be performed, for example, by the storage device 20 of FIGS. 1, 2, and 3.

In operation S110, the controller 100 may transmit a soft read command to the nonvolatile memory device 200. The soft read command may be a command instructing the nonvolatile memory device 200 to perform a soft decision process on a memory cell using a soft read voltage.

In operation S120, the nonvolatile memory device 200 may generate soft-bit data in response to the soft read command. For example, the soft-bit data may be the soft-bit data SOFT_BIT_DATA described with reference to FIG. 7. The soft-bit data may be composed of a plurality of soft-bits sensed by soft decisions. The soft-bits may include strong bits and/or weak bits.

In operation S130, the control logic circuit 210 of the nonvolatile memory device 200 may provide a stage control signal to the compression circuit 260 to control the compression circuit 260 through a plurality of compression stages. The plurality of compression stages may correspond to the compression stages ST_1, ST_2, . . . of FIG. 1, the compression stages STAGE_1, STAGE_2, and STAGE_3 of FIG. 10, and compression stages 'Stage K' of FIG. 13. Each of the plurality of compression stages may be performed by each of a different plurality of stage compression circuits as illustrated in FIG. 10, or may be repeatedly performed by the same stage compression circuit as illustrated in FIG. 13.

The compression circuit 260 may control whether compression in each of the plurality of compression stages is performed based on a stage control signal, and may generate compressed soft-bit data obtained by compressing the soft-bit data. The compression ratio of the soft-bit data may be achieved by the stage compression ratio of each of the plurality of compression stages that perform compression.

At least some of the plurality of compression stages may generate output data by compressing input data of the compression stage based on a stage control signal. The input data and output data of the compression stage include a plurality of pieces of the cell data, and each of the cell data may be composed of one of the index code and the dummy code. The index code may indicate the position and/or order of the weak bit in the soft-bit data SOFT_BIT_DATA. The index code of the input data input to the compression circuit 260 may be determined based on the mapping table.

At least some of the plurality of compression stages may generate the output data by selecting at least one piece of cell data among the plurality of pieces of cell data of the input data based on the stage control signal.

In operation S140, the nonvolatile memory device 200 may transmit the compressed soft-bit data to the controller 100. The controller 100 may decompress the compressed soft-bit data, may extract the index code, and may generate the soft-bit data using the extracted index code based on the mapping table. The controller 100 may perform error correction decoding based on the generated soft-bit data.

According to some implementations, the storage device and the operating method thereof may improve the lifespan and/or the performance of the storage device.

According to some implementations, the storage device and the operating method thereof may improve the lifespan and/or the performance of the storage device by compressing soft-bit data in a nonvolatile memory device and then transmitting the compressed soft-bit data to a controller.

According to some implementations, the storage device and the operating method thereof may efficiently change the compression ratio of the soft-bit data.

While this disclosure contains many specific implementation details, these should not be construed as limitations on the scope of what may be claimed. Certain features that are described in this disclosure in the context of separate implementations can also be implemented in combination in a single implementation. Conversely, various features that are described in the context of a single implementation can also be implemented in multiple implementations separately or in any suitable subcombination. Moreover, although features may be described above as acting in certain combinations, one or more features from a combination can in some cases be excised from the combination, and the combination may be directed to a subcombination or variation of a subcombination.

While the present disclosure has been described with reference to various examples, it will be apparent to those of ordinary skill in the art that various changes and modifications may be made thereto without departing from the spirit and scope of the present disclosure as set forth in the following claims.

What is claimed is:

1. A storage device comprising:

a nonvolatile memory device configured to store and read user data; and a controller configured to control the nonvolatile memory device, wherein the nonvolatile memory device includes:

a memory cell array including a plurality of memory cells configured to store data bits corresponding to the user data, a compression circuit configured to compress, in a plurality of compression stages, soft-bit data sensed from the plurality of memory cells, and control logic configured to transmit a stage control signal to the compression circuit, wherein the stage control signal controls whether compression in each of the plurality of compression stages is performed.

2. The storage device of claim 1, wherein input data and output data of each of the plurality of compression stages include at least one same index code, and wherein the at least one same index code corresponds to a position of a weak bit in the soft-bit data.

3. The storage device of claim 1, wherein, in at least one compression stage of the plurality of compression stages, output data generated by compressing input data in a previous compression stage is compressed at a preset compression ratio.

4. The storage device of claim 1, wherein the control logic is configured to transmit different stage control signals to the compression circuit based on a compression ratio for the soft-bit data.

5. The storage device of claim 1, wherein each of the plurality of compression stages is performed by a corresponding stage compression circuit of a plurality of stage compression circuits included in the compression circuit, and wherein each of the plurality of stage compression circuits is configured to:

receive input data including a plurality of pieces of cell data, and select, as output data, at least a portion of the plurality of pieces of cell data, wherein each of the plurality of pieces of cell data is composed of one of a dummy code or an index code, and wherein the index code corresponds to a position of a weak bit in the soft-bit data.

6. The storage device of claim 5, wherein a configuration of inputs and outputs between the plurality of stage compression circuits is controlled by the stage control signal.

7. The storage device of claim 5, wherein the compression circuit includes a converting circuit configured to convert the weak bit of the soft-bit data into the index code based on a preset mapping table, and wherein the preset mapping table represents a mapping between the index code and a position or order of soft-bits included in the soft-bit data.

8. The storage device of claim 5, wherein the plurality of compression stages include a first compression stage and a second compression stage, wherein the plurality of stage compression circuits include a first stage compression circuit configured to perform the first compression stage and a second stage compression circuit configured to perform the second compression stage, and wherein each of the first stage compression circuit and the second stage compression circuit is configured to generate corresponding output data by selecting a portion of cell data from corresponding input data, based on a corresponding stage compression ratio.

9. The storage device of claim 8, wherein the corresponding stage compression ratios of the first stage compression circuit and the second stage compression circuit are different.

10. The storage device of claim 5, wherein each of the plurality of stage compression circuits is configured to preferentially select the index code when selecting at least the portion of the plurality of pieces of cell data.

11. The storage device of claim 1, wherein the control logic is configured to control a number of utilized stages in the plurality of compression stages based on a target compression ratio.

12. The storage device of claim 1, wherein the compression circuit is configured to compress the soft-bit data with a first compression ratio during a first time period and compress the soft-bit data with a second compression ratio during a second time period, wherein the second time period is a period after the first time period, and wherein the second compression ratio is less than the first compression ratio.

13. The storage device of claim 12, wherein the control logic is configured to provide a compression ratio change signal to the controller in response to a change from the first compression ratio to the second compression ratio, wherein the compression circuit is configured to generate output data by compressing input data including an index code and a dummy code, wherein the compression circuit is configured to generate the compression ratio change signal to include a code not included in a mapping table, and wherein the index code comprises a code converted based on the mapping table in which a weak bit of the soft-bit data is preset.

14. The storage device of claim 12, wherein the compression circuit is configured to generate output data by compressing input data including an index code and a dummy code, wherein the compression circuit is configured to perform compression based on a first mapping table when using the first compression ratio, and to perform compression based on a second mapping table when using the second compression ratio, wherein the controller is configured to determine a change from the first compression ratio to the second compression ratio based on a bit configuration of a first bit sequence, in the output data, having a size corresponding to the first compression ratio, and wherein the index code comprises a code converted based on a mapping table in which a weak bit of the soft-bit data is preset.

15. The storage device of claim 14, wherein the compression circuit is configured to use a last index code of the second mapping table as the dummy code when using the first compression ratio, and to perform compression using a last index code of the first mapping table when using the second compression ratio.

16. The storage device of claim 1, wherein a compression ratio applied by the compression circuit is independent of a bit configuration of input data.

17. The storage device of claim 16, wherein a compression ratio applied by the compression circuit is changed based on a remaining lifespan of the memory cell array.

18. A method comprising:

transmitting, by a controller configured to control a nonvolatile memory device, a soft read command to the nonvolatile memory device;

generating, by the nonvolatile memory device, soft-bit data in response to the soft read command;

providing, by a control logic circuit of the nonvolatile memory device, a stage control signal to a compression circuit, to control compression by the compression circuit in a plurality of compression stages;

generating, by the compression circuit, compressed soft-bit data by compressing the soft-bit data based on the stage control signal; and transmitting, by the nonvolatile memory device, the compressed soft-bit data to the controller, wherein the stage control signal controls whether compression in each of the plurality of compression stages is performed.

19. The method of claim 18, further comprising:

changing, by the control logic circuit, a compression ratio applied by the compression circuit; and transmitting, by the control logic circuit, a signal corresponding to the change in the compression ratio to the controller.

20. A storage device comprising:

a nonvolatile memory device configured to store and read user data; and a controller configured to control the nonvolatile memory device, wherein the nonvolatile memory device includes:

a memory cell array including a plurality of memory cells configured to store data bits corresponding to the user data, a plurality of compression circuits configured to compress soft-bit data sensed from the plurality of memory cells, and a control logic circuit configured to control the plurality of compression circuits, wherein the plurality of compression circuits include:

a converting circuit configured to, based on a mapping table, convert the soft-bit data into input data comprising index codes and dummy codes, a first compression circuit configured to compress the input data at a first compression ratio, to obtain first output data, a second compression circuit configured to receive the first output data from the first compression circuit and to generate second output data by compressing the first output data at a second compression ratio, wherein the control logic circuit controls whether the first output data is provided to the second compression circuit based on a target compression ratio for the soft-bit data.

* * * * *